US011035721B2

(12) United States Patent
Oishi et al.

(10) Patent No.: US 11,035,721 B2
(45) Date of Patent: Jun. 15, 2021

(54) SUBSTRATE PROCESSING APPARATUS, VIBRATION DETECTION SYSTEM AND NON-TRANSITORY COMPUTER-READABLE RECORDING MEDIUM

(71) Applicant: KOKUSAI ELECTRIC CORPORATION, Tokyo (JP)

(72) Inventors: Mamoru Oishi, Toyama (JP); Yasuhiro Matsuda, Toyama (JP); Masaya Nishida, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 285 days.

(21) Appl. No.: 16/296,880

(22) Filed: Mar. 8, 2019

(65) Prior Publication Data

US 2019/0204144 A1 Jul. 4, 2019

Related U.S. Application Data

(63) Continuation of application No. PCT/JP2016/078820, filed on Sep. 29, 2016.

(51) Int. Cl.
*G01N 29/12* (2006.01)
*H01L 21/67* (2006.01)
(Continued)

(52) U.S. Cl.
CPC ............ *G01H 11/06* (2013.01); *G01H 13/00* (2013.01); *G01N 29/12* (2013.01); *G06F 9/3004* (2013.01);
(Continued)

(58) Field of Classification Search
CPC ......... H01L 21/67288; H01L 21/67092; H01L 21/67769; H01L 2021/607; G06F 9/3004; G01H 13/00
(Continued)

(56) References Cited

U.S. PATENT DOCUMENTS 10,032,656 B2 * 7/2018 Shinozaki ......... H01L 21/67046
2011/0125331 A1 * 5/2011 Fujii ................. H01L 21/67288
700/280
(Continued)

FOREIGN PATENT DOCUMENTS

JP 2003-109999 A 4/2003

*Primary Examiner* — Jacques M Saint Surin
(74) *Attorney, Agent, or Firm* — Volpe Koenig

(57) ABSTRACT

A substrate processing apparatus includes: a placement part whereon a substrate container is placed; a substrate retainer supporting the substrate; transfer mechanisms configured to transfer the substrate between the substrate container and the substrate retainer and to perform a transfer operation; a detector provided at one or more of the transfer mechanisms to detect vibration; a memory device that registers, in advance, natural frequencies of the substrate and one or more of the transfer mechanisms and threshold values of the substrate and the plurality of transfer mechanisms; and a monitoring part to monitor whether an intensity of the vibration, based on transformed data obtained by transforming detection data, exceeds at least one of the threshold values of the substrate and the plurality of transfer mechanisms and whether a vibration frequency is equal to at least one of the natural frequencies of the substrate and the plurality of transfer mechanisms.

10 Claims, 11 Drawing Sheets

(51) Int. Cl.
    *G06F 9/30*        (2018.01)
    *G01H 13/00*       (2006.01)
    *H01L 21/677*      (2006.01)
    *G01H 11/06*       (2006.01)
    *H01L 21/607*      (2006.01)

(52) U.S. Cl.
    CPC .. *H01L 21/67092* (2013.01); *H01L 21/67288* (2013.01); *H01L 21/67769* (2013.01); *H01L 2021/607* (2013.01)

(58) Field of Classification Search
    USPC .......................................................... 73/654
    See application file for complete search history.

(56) References Cited

U.S. PATENT DOCUMENTS

| | | | | |
|---|---|---|---|---|
| 2015/0000591 A1* | 1/2015 | Kawasaki | ......... | H01L 21/67775 118/695 |
| 2015/0340258 A1* | 11/2015 | Hiyashi | ............ | H01L 21/67772 414/416.03 |
| 2018/0265294 A1* | 9/2018 | Hayashi | ............ | H01L 21/67769 |

\* cited by examiner

SUBSTRATE PROCESSING APPARATUS, VIBRATION DETECTION SYSTEM AND NON-TRANSITORY COMPUTER-READABLE RECORDING MEDIUM

CROSS-REFERENCE TO RELATED PATENT APPLICATION

This non-provisional U.S. patent application claims priority under 35 U.S.C. § 119 of International Application No. PCT/JP2016/078820, filed on Sep. 29, 2016, in the WIPO, the entire contents of which are hereby incorporated by reference.

BACKGROUND

1. Field

The present disclosure relates to a substrate processing apparatus, a vibration detection system and a non-transitory computer-readable recording medium.

2. Description of the Related Art

Conventionally, as one of manufacturing processes of a semiconductor device such as a DRAM (dynamic random-access memory) and IC (integrated circuit), a substrate processing for processing a substrate (hereinafter, also referred to as a "wafer") may be performed by a substrate processing apparatus such as a semiconductor manufacturing apparatus based on a recipe (hereinafter, also referred to as a "process recipe") in which process conditions and process sequences are defined.

The substrate (wafer) may be processed by a batch type semiconductor manufacturing apparatus that processes the substrate by holding a predetermined number of substrates by a substrate retainer (hereinafter, also referred to as a "boat"). However, when the wafer is warped, the wafer and a transfer system of the wafer may contact each other while the wafer is being transferred by the transfer system. For example, a collision sensor capable of detecting a vibration due to a collision is provided at the substrate transfer system such as a substrate transport mechanism to prevent the wafer from being damaged or the boat and a substrate container from being turned over. However, recently, even when the wafer is not warped, it is found that a positional deviation of the substrate may occur when the vibration having a frequency near a natural frequency of the substrate occurs, and particles may be generated due to the positional deviation.

SUMMARY

Described herein is a technique capable of reducing a risk of the productivity loss due to a positional deviation of a substrate.

According to one aspect of the present disclosure, there is provided a substrate processing apparatus including:
a placement part whereon a substrate container is placed;
a substrate retainer configured to support the substrate accommodated in the substrate container;
a plurality of transfer mechanisms configured to transfer the substrate between the substrate container and the substrate retainer and to perform a transfer operation;
a detector provided at one or more of the plurality of transfer mechanisms and configured to detect vibration;
a memory device configured to register in advance natural frequencies of the substrate and the one or more of the plurality of transfer mechanisms and a threshold value of the substrate and threshold values of the plurality of transfer mechanisms; and
a monitoring part configured to monitor whether an intensity of the vibration based on transformed data obtained by transforming detection data of the vibration detected by the detector exceeds at least one of the threshold value of the substrate and the threshold values of the plurality of transfer mechanisms and whether a vibration frequency of the vibration based on transformed data is equal to at least one of the natural frequency of the substrate and natural frequencies of the plurality of transfer mechanisms.

DETAILED DESCRIPTION

Embodiments

Hereinafter, one or more embodiments according to the technique will be described.

(1) Configuration of Substrate Processing Apparatus

Hereinafter, a substrate processing apparatus 100 according to the embodiments will be described with reference to FIGS. 1 through 3.

Figure 1:
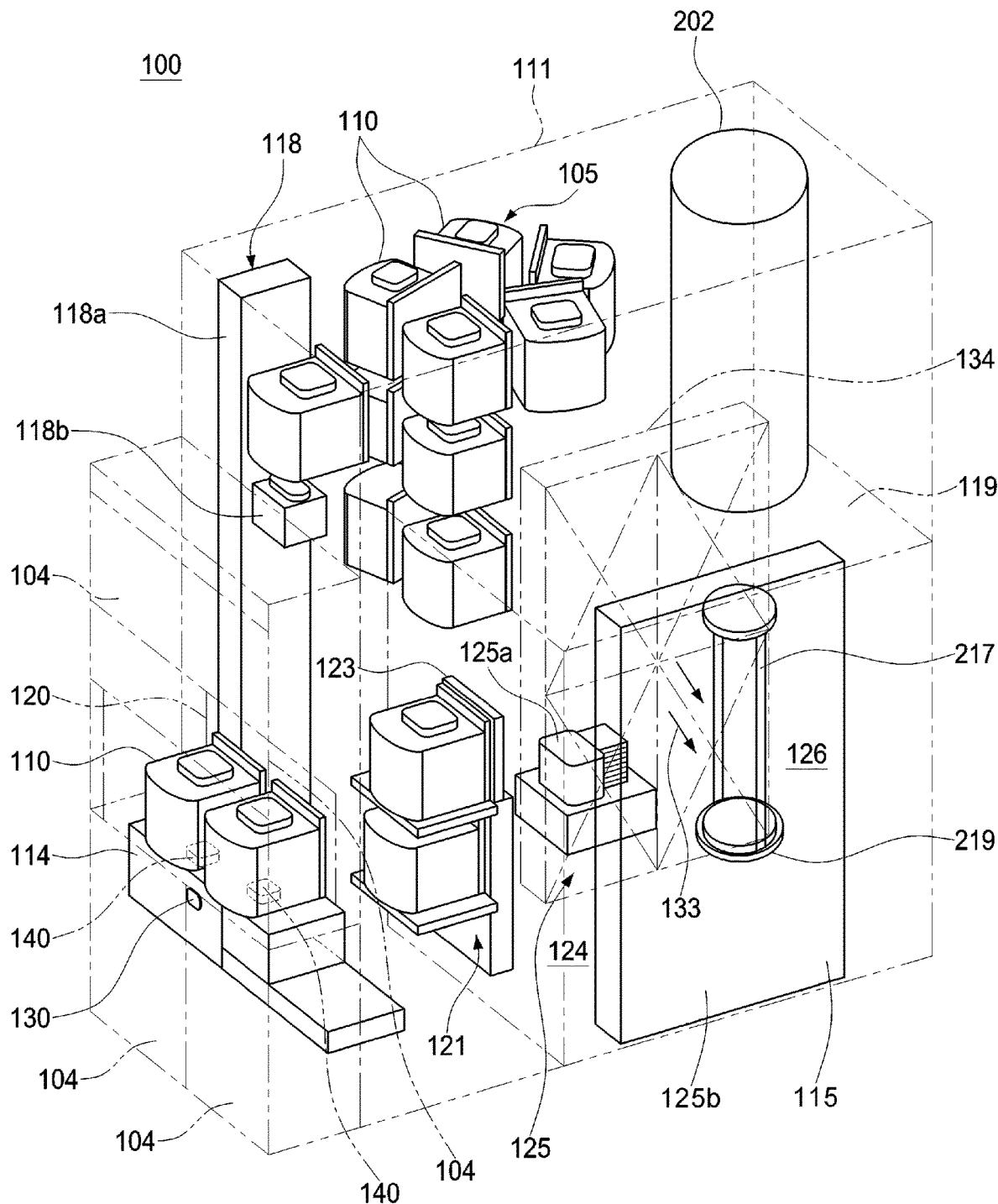
FIG. 1 illustrates a perspective view of a substrate processing apparatus preferably used in one or more embodiments described herein.
Figure 2:
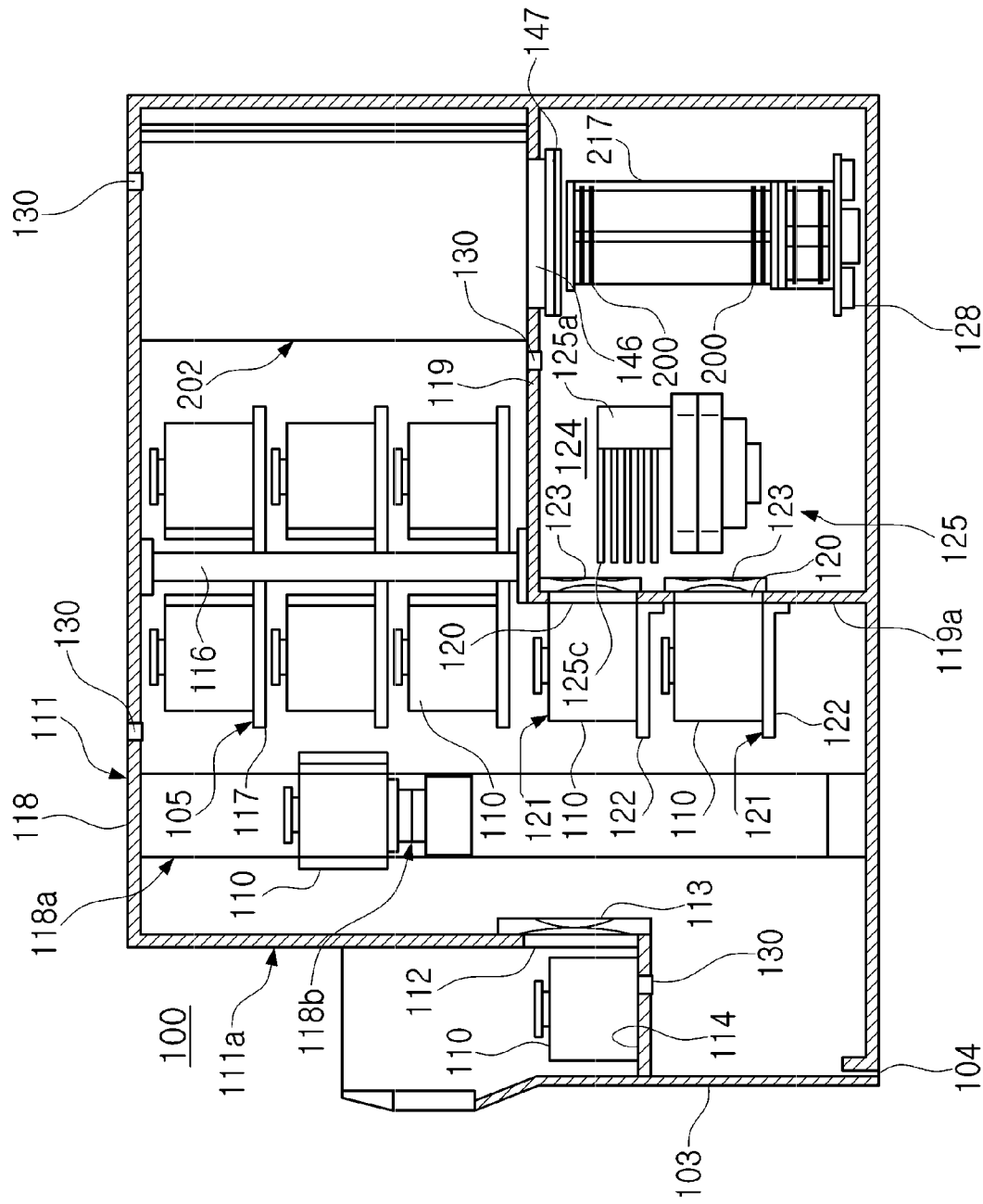
FIG. 2 illustrates another perspective view of the substrate processing apparatus preferably used in the embodiments.

As shown in FIGS. 1 and 2, the substrate processing apparatus 100 includes a housing 111 configured as a pressure resistant container. An opening portion 103 is provided at a lower front side of a front wall 111a of the housing 111 in order to maintain the substrate processing apparatus 100. A pair of front doors 104 is provided at the opening portion 103. The pair of front doors 104 functions as an opening/closing mechanism configured to open or close the opening portion 103. A pod 110 serving as a substrate container accommodating wafers including a wafer (substrate) 200 such as a silicon wafer is used as a carrier to transfer the wafers including the wafer 200 into or out of the housing 111.

A pod loading/unloading port 112 is provided at the front wall 111a of the housing 111 for loading and unloading the pod 110 into and out of the housing 111. The pod loading/unloading port 112 is opened or closed by a front shutter 113. A loading port shelf 114 serving as a placement part is provided at a front side of the pod loading/unloading port 112. The pod 110 is aligned while placed on the loading port shelf 114.

A rotatable pod shelf 105 serving as a placement part is provided over the substantially center portion of the housing 111. The rotatable pod shelf 105 may hold a plurality of pods 110. The rotatable pod shelf 105 includes a vertical column 116 capable of rotating horizontally and a plurality of shelf plates 117 provided at an upper end portion, a mid portion and a lower end portion of the vertical column 16 in the radial direction. The plurality of shelf plates 117 is configured to support the plurality of pods 110 while the plurality of pods 110 is placed thereon.

A pod transfer device 118 serving as a first transfer device is provided between the loading port shelf 114 and the rotatable pod shelf 105 in the housing 111. The pod transfer device 118 includes a pod elevator 118a capable of elevating (rising and lowering) while supporting the pod 110 and a pod transfer mechanism 118b. The pod transfer device 118 transfers the pod 110 among the loading port shelf 114, the rotatable pod shelf 105 and a pod opener 121 by consecutive operations of the pod elevator 118a and the pod transfer mechanism 118b.

A sub-housing 119 is provided below the substantially center portion in the housing 111 toward a rear end of the housing 111. A pair of wafer loading/unloading ports 120 is provided at the front wall 119a of the sub-housing 119 for loading and unloading the wafers including the wafer 200 into and out of the sub-housing 119. The pod opener 121 is provided at the pair of wafer loading/unloading ports 120, respectively. The pod opener 121 provided at an upper wafer loading/unloading port 120 is also referred to as an upper pod opener 121 and the pod opener 121 provided at a lower wafer loading/unloading port 120 is also referred to as a lower pod opener 121. In the present specification, the upper pod opener 121 and the lower pod opener 121 are collectively referred to as the pod opener 121.

The pod opener 121 includes a placement table 122 serving as a placement part where the pod 110 is placed thereon and a cap attaching/detaching mechanism 123 configured to attach or detach a cap of the pod 110. By detaching or attaching the cap of the pod 110 placed on the placement table 122 by the pod opener 121, a wafer entrance of the pod 110 is opened or closed.

The sub-housing 119 defines a transfer chamber 124 fluidically isolated from the space in which the pod transfer device 118 or the rotatable pod shelf 105 is provided. A wafer transport mechanism (also referred to as a "substrate transport mechanism") 125 is provided at a front portion of the transfer chamber 124. The wafer transport mechanism 125 includes a wafer transport device (also referred to as a "substrate transport device") 125a and a wafer transport device elevator (also referred to as a "substrate transport device elevating mechanism") 125b. The wafer transport device 125a is capable of horizontally rotating or moving the wafer 200. The wafer transport device elevator 125b is capable of elevating or lowering the wafer transport device 125a. The wafer transport device elevator 125b is provided between a right end of the front portion of the transfer chamber 124 of the sub-housing 119 and a right side end of the housing 111. The wafer transport device 125a is further includes tweezers 125c serving as a substrate holder capable of supporting the wafer 200. The wafer transport mechanism 125 is configured to charge or discharge the wafer 200 into or out of a boat 217 by consecutive operations of the wafer transport device elevator 125b and the wafer transport device 125a.

Figure 11:
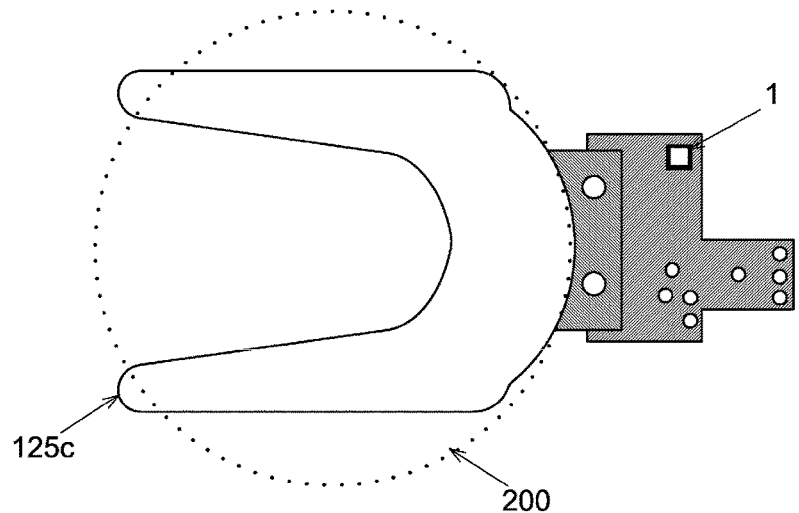
FIG. 11 illustrates a vibration sensor provided in the vicinity of tweezers and used in the vibration detection system described herein.

In the embodiments, as shown in FIG. 11, an acceleration pickup sensor (hereinafter also referred to as an "acceleration sensor") 1 serving as a vibration sensor is provided in the vicinity of the tweezers 125c. The vibration sensor 1 is also simply referred to as a "detector" in the present specification. As described above, the vibration sensor 1 serving as a detecting mechanism (detector) is configured to detect vibration while the wafer transport mechanism 125 is in operation.

As shown in FIG. 2, a process furnace 202 is provided above a standby space 126 where the boat 217 is accommodated and in standby. A lower end of the process furnace 202 is opened or closed by a furnace opening shutter 147.

As shown in FIG. 1, a boat elevator 115 is provided in the sub-housing 119 (that is, in the transfer chamber 124). The boat elevator 115 is configured to elevate or lower the boat 217. An arm 128 is connected to an elevating table (not shown) of the boat elevator 115. A seal cap 219 is provided horizontally at the arm 128. The seal cap 219 is configured to support the boat 217 vertically and to close the lower end of the process furnace 202.

A transfer mechanism according to the embodiments is mainly constituted by the rotatable pod shelf 105, the boat elevator 115, the pod transfer device (also referred to as a "substrate container transfer device") 118, the wafer transport mechanism (substrate transport mechanism) 125, the boat 217 and a rotating mechanism 254 described later. The rotatable pod shelf 105, the boat elevator 115, the pod transfer device (substrate container transfer device) 118, the wafer transport mechanism (substrate transport mechanism) 125, the boat 217 and the rotating mechanism 254 are electrically connected to a transfer control mechanism (transfer controller) 11 described later.

The boat 217 includes a plurality of support parts. The boat 217 is configured to support the wafers including the wafer 200 which are concentrically arranged in the vertical direction while each of the wafers is horizontally oriented.

As shown in FIG. 1, a clean air supply mechanism 134 is provided at a left end of a left side portion of the transfer chamber 124 opposite to the boat elevator 115 and the wafer transport device elevator 125b. The clean air supply mechanism 134 is configured to supply clean air 133 such as an inert gas and a clean atmosphere.

The clean air 133 ejected from the clean air supply mechanism 134 flows around the wafer transport device 125a and the boat 217 accommodated in the standby space 126. Thereafter, the clean air 133 is exhausted from the housing 111 through a duct (not shown) or circulated back to a primary side (supply side) of the clean air supply mechanism 134 and then ejected again into the transfer chamber 124 by the clean air supply mechanism 134.

Apparatus covers (not shown) serving as entrances configured to enter the substrate processing apparatus 100 are provided on the outer circumferences of the housing 111 and the sub-housing 119. The apparatus covers may be removed during the maintenance such that a repair personnel may access the substrate processing apparatus 100. A door switch 130 serving as an access sensor is provided at the end portions of the housing 111 and the sub-housing 119 facing the apparatus covers. A substrate detecting sensor 140 configured to detect whether the pod 110 is placed on the loading port shelf 114 is provided at the loading port shelf 114. Switches such as the door switch 130 and sensors such as the substrate detecting sensor 140 are electrically connected to an apparatus controller 240 described later.

(2) Operation of Substrate Processing Apparatus

Hereinafter, the operation of the substrate processing apparatus 100 according to the embodiments will be described with reference to FIGS. 1 and 2.

As shown in FIGS. 1 and 2, when the pod 110 is placed on the loading port shelf 114 by an in-process transfer device (not shown) such as an RGV (Rail Guided Vehicle), the pod 110 is detected by the substrate detecting sensor 140 and the pod loading/unloading port 112 is opened by the front shutter 113. The pod 110 placed on the loading port shelf 114 is loaded into the housing 111 through the pod loading/unloading port 112 by the pod transfer device 118.

The pod 110 loaded into the housing 111 is automatically transferred to and temporarily stored in the designated shelf plate 117 of the rotatable pod shelf 105 by the pod transfer device 118. Thereafter, the pod 110 is transferred to the placement table 122 of one of the upper pod opener 121 and the lower pod opener 121 from the designated shelf plate 117. Alternatively, the pod 110 loaded into the housing 111 may be transferred directly to the placement table 122 of the one of the upper pod opener 121 and the lower pod opener 121 by the pod transfer device 118.

When the wafer entrance of the pod 110 placed on the placement table 122 is pressed against the wafer loading/unloading port 120 of the front wall 119a of the sub-housing 119, the cap attaching/detaching mechanism 123 detaches the cap of the pod 110 and the wafer entrance of the pod 110 is opened. Thereafter, the wafer 200 is transported out of the pod 110 by the tweezers 125c of the wafer transport device 125a via the wafer entrance, and aligned by a notch alignment device (not shown). The wafer 200 is then loaded into the standby space 126 provided behind the transfer chamber 124, and is charged into the boat 217. After charging the wafer 200 into the boat 217, the wafer transport device 125a then returns to the pod 110 and transports the next wafer 200 from the pod 110 into the boat 217.

While the transport mechanism 125 loads the wafers including the wafer 200 from the one of the upper pod opener 121 and the lower pod opener 121 into the boat 217, another pod 110 is transferred to and placed on the placement table 122 of the other one of the upper pod opener 121 and the lower pod opener 121 from the rotatable pod shelf 105 by the pod transfer device 118, and the cap of the another pod 110 is opened by the other one of the upper pod opener 121 and the lower pod opener 121.

After a predetermined number of the wafers including the wafer 200 are loaded (charged) into the boat 217, the lower end of the process furnace 202 closed by the furnace opening shutter 147 is opened by the furnace opening shutter 147. Then, the seal cap 219 is elevated by the boat elevator 115 and the boat 217 with the predetermined number of the wafers including the wafer 200 is loaded into the process furnace 202.

After the boat 217 with the predetermined number of the wafers is loaded into the process furnace 202, the wafers including the wafer 200 are processed in the process furnace 202. After the wafers are processed, the boat 217 is unloaded out of the process furnace 202 in an order reverse to that described above except for an aligning process of the wafers by the notch alignment device (not shown), and the pod 110 accommodating the processed wafers including the wafer 200 is transported out of the housing 111.

(3) Configuration of Process Furnace

Hereinafter, a configuration of the process furnace 202 according to the embodiments will be described with reference to FIG. 3. FIG. 3 schematically illustrates a vertical cross-section of the process furnace 202 of the substrate processing apparatus 100 preferably used in the embodiments.

Figure 3:
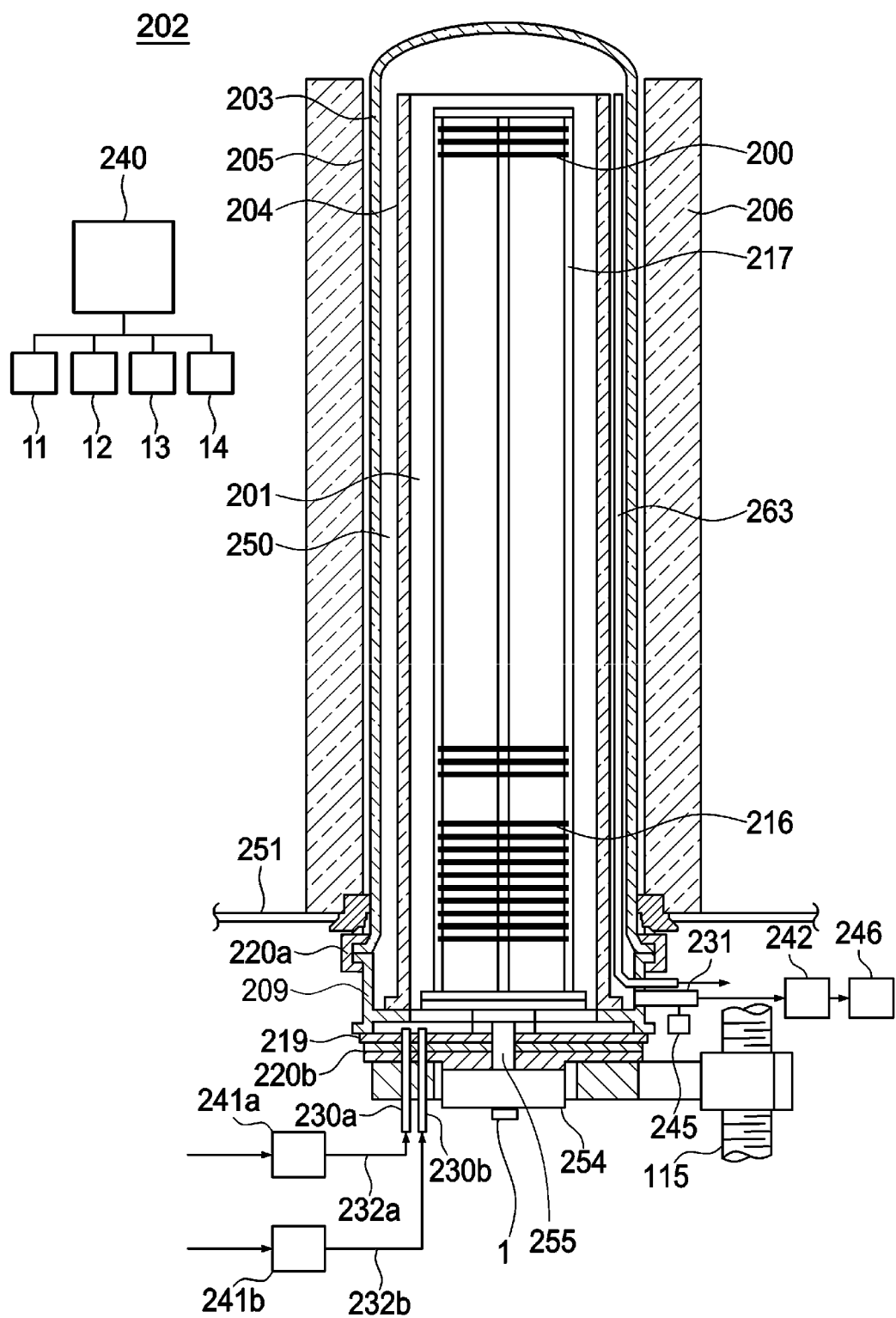
FIG. 3 illustrates a vertical cross-section of a process furnace of the substrate processing apparatus preferably used in the embodiments.

As shown in FIG. 3, the process furnace 202 includes a process tube 203 serving as a reaction tube. The process tube 203 includes an inner tube 204 serving as an inner reaction tube and an outer tube 205 serving as an outer reaction tube and provided outside the inner tube 204. The inner tube 204 is cylindrical with open upper and lower ends. A process chamber 201 where the wafers including the wafer 200 serving as a substrate are processed is provided in a hollow portion of the inner tube 204. The process chamber 201 is configured to accommodate the boat 217 described later. The outer tube 205 is provided concentrically with the inner tube 204. The inner diameter of the outer tube 205 is larger than the outer diameter of the inner tube 204. The outer tube 205 is cylindrical with a closed upper end and an open lower end.

A heater 206 serving as a heating mechanism is provided at the outside of the process tube 203 to surround a side wall of the process tube 203. The heater 206 is cylindrical. The heater 206 is vertically supported by a heater base 251 serving as a support plate.

A manifold 209 is provided under the outer tube 205. The reaction tube 205 and the manifold 209 are concentrically arranged. The manifold 209 is cylindrical with open upper and lower ends. The manifold 209 vertically supports the lower end of the inner tube 204 and the lower end of the outer tube 205. The manifold 209 engages with the lower end of the inner tube 204 and the lower end of the outer tube 205, respectively. A sealing part such as an O-ring 220a is provided between the manifold 209 and the outer tube 205. By supporting the manifold 209 on the heater base 251, the process tube 203 is vertically provided. A reaction vessel is constituted by the process tube 203 and the manifold 209.

A process gas nozzle 230a and a purge gas nozzle 230b are connected to the seal cap 219 described later to communicate with the process chamber 201. Each of the process gas nozzle 230a and the purge gas nozzle 230b serves as a part of a gas introduction mechanism. A process gas supply pipe 232a is connected to the process gas nozzle 230a. Components such as a process gas supply source (not shown) are connected to the upstream side of the process gas supply pipe 232a (that is, the side opposite to where the process gas nozzle 230a is connected) through a mass flow controller 241a serving as a gas flow rate controller. Hereinafter, the term "mass flow controller" is referred to as a "MFC". A purge gas supply pipe 232b is connected to the purge gas nozzle 230b. Components such as a purge gas supply source (not shown) are connected to the upstream side of the purge gas supply pipe 232b (that is, the side opposite to where the purge gas nozzle 230b is connected) through an MFC 241b.

A process gas supply system according to the embodiments is configured mainly by the process gas supply source (not shown), the MFC 241a, the process gas supply pipe 232a and the process gas nozzle 230a. A purge gas supply system according to the embodiments is constituted mainly by the purge gas supply source (not shown), the MFC 241b, the purge gas supply pipe 232b and the purge gas nozzle 230b. A gas supply system according to the embodiments is constituted mainly by the process gas supply system and the purge gas supply system. A gas supply controller 14 is electrically connected to the MFCs 241a and 241b.

An exhaust pipe 231 configured to exhaust an inner atmosphere of the process chamber 201 is provided at the manifold 209. The exhaust pipe 231 is disposed at a lower end of a cylindrical space 250 which is a gap between the inner tube 204 and the outer tube 205. The exhaust pipe 231 is spatially connected to the cylindrical space 250. A pressure sensor 245 serving as a pressure detector, a pressure adjusting device 242 such as an APC (Automatic Pressure Controller) and a vacuum pump 246 serving as a vacuum exhaust device are sequentially connected to the downstream side of the exhaust pipe 231 (that is, the side opposite to where the manifold 209 is connected) from the upstream side to the downstream side of the exhaust pipe 231. A gas exhaust mechanism according to the embodiments is constituted mainly by the exhaust pipe 231, the pressure sensor 245 and the pressure adjusting device 242. A pressure controller 13 is electrically connected to the pressure adjusting device 242 and the pressure sensor 245.

The seal cap 219 capable of sealing the manifold 209 in airtight manner is provided under the manifold 209. The seal cap 219 is in contact with the lower end of the manifold 209 from thereunder. The seal cap 219 is disk-shaped. An O-ring 220b, serving as a sealing part and being in contact with the lower end of the manifold 209, is provided on an upper surface of the seal cap 219.

The rotating mechanism 254 configured to rotate the boat 217 is provided about a center portion of the seal cap 219 opposite to the process chamber 201. A rotating shaft 255 of the rotating mechanism 254 is connected to the boat 217 through the seal cap 219 and supports the boat 217 from thereunder. The rotating mechanism 254 is capable of rotating the wafers including the wafer 200 by rotating the boat 217.

According to the embodiments, the vibration sensor 1 is provided in the vicinity of the rotating mechanism 254 in order to detect the vibration of the boat 217. The vibration sensor 1 detects the vibration while the rotating mechanism 254 is in operation, that is, while the boat 217 is rotated by the rotating mechanism 254. The vibration sensor 1 may further detect the vibration when the boat 217 is elevated.

The seal cap 219 may be moved upward/downward in the vertical direction by the boat elevator 115 serving as a substrate retainer elevating mechanism installed outside the process tube 203. When the seal cap 219 is moved upward/downward by the boat elevator 115, the boat 217 may be loaded into the process chamber 201 or unloaded out of the process chamber 201. The transfer control mechanism (transfer controller) 11 is electrically connected to the rotating mechanism 254 and the boat elevator 115.

As described above, the boat 217 is configured to support the wafers including the wafer 200 while the wafers are concentrically arranged in the vertical direction and horizontally oriented. For example, the boat 217 is made of a heat resistant material such as quartz or silicon carbide. Insulating plates 216 serving as an insulating part are provided under the boat 217. The insulating plates 216 are concentrically arranged in the vertical direction and in horizontal orientation. The insulating plates 216 are disk-shaped. For example, the insulating plates 216 are made of a heat resistant material such as quartz or silicon carbide. The insulating plates 216 are configured to suppress the heat transfer from the heater 207 to the manifold 209.

A temperature sensor 263 serving as a temperature detector is provided in the process tube 203. A heating mechanism according to the embodiments is constituted mainly by the heater 206 and the temperature sensor 263. A temperature controller 12 is electrically connected to the heater 206 and the temperature sensor 263.

A substrate processing system according to the embodiments is constituted mainly by the gas exhaust mechanism, the gas supply system and the heating mechanism.

(4) Operation of Process Furnace

Hereinafter, a method of forming a film on the wafer 200 using the process furnace 202 described above, which is one of processes for manufacturing a semiconductor device, will be described with reference to FIG. 3. In the description below, the apparatus controller 240 configured to control the operation of the substrate processing apparatus 100 controls the operations of the components of the substrate processing apparatus 100.

After the wafers including the wafer 200 are charged into the boat 217 (wafer charging), the boat 217 charged with the wafers is elevated by the boat elevator 115 and loaded into the process chamber 201 (boat loading). Then, the seal cap 219 seals the lower end of the manifold 209 via the O-ring 220b.

The vacuum pump 246 serving as the vacuum exhaust device vacuum-exhausts the process chamber 201 such that an inner pressure of the process chamber 201 is at a desired pressure (vacuum level). The inner pressure of the process chamber 201 is measured by the pressure sensor 245, and the pressure adjusting device 242 is feedback-controlled based on the measured pressure. That is, the opening degree of a valve of the pressure adjusting device 242 is feedback-controlled. The heater 206 heats the process chamber 201 such that the temperature of the wafer 200 in the process chamber 201 reaches and is maintained at a desired temperature. The amount of current supplied to the heater 206 is feedback-controlled based on the temperature detected by the temperature sensor 263. The boat 217 and the wafers including the wafer 200 are rotated by the rotating mechanism 254. While the rotating mechanism 254 is in operation, the vibration sensor 1 detects the vibration of the boat 217.

Thereafter, a process gas is supplied from the process gas supply source (not shown). The process gas having the flow rate thereof adjusted to a desired flow rate by the MFC 241a is supplied into the process chamber 201 through the process gas supply pipe 232a and the process gas nozzle 230a. The process gas supplied into the process chamber 201 flows upward in the process chamber 201 and flows into the cylindrical space 250 through an opening portion at the upper end of the inner reaction tube 204, and is exhausted through the exhaust pipe 231. The process gas contacts the surfaces of the wafer 200 as it passes through the process chamber 201, whereby a film is deposited on the surface of the wafer 200 by thermal reaction.

After a predetermined processing time elapses, a purge gas is supplied from the purge gas supply source (not shown). The purge gas having the flow rate thereof adjusted to a desired flow rate by the MFC 241b is supplied into the process chamber 201. The inner atmosphere of the process chamber 201 is replaced with the inert gas, and the inner pressure of the process chamber 201 is returned to a normal pressure.

Thereafter, the seal cap 219 is lowered by the boat elevator 115 and the lower end of the manifold 209 is opened. The processed wafers including the wafer 200 are unloaded out of the process tube 203 through the lower end of the manifold 209 while being supported by the boat 217 (boat unloading). The processed wafers including the wafer 200 are then discharged from the boat 217 and stored in the pod 110 (wafer discharging).

(5) Configuration of the Controller (Apparatus Controller)

Figure 4:
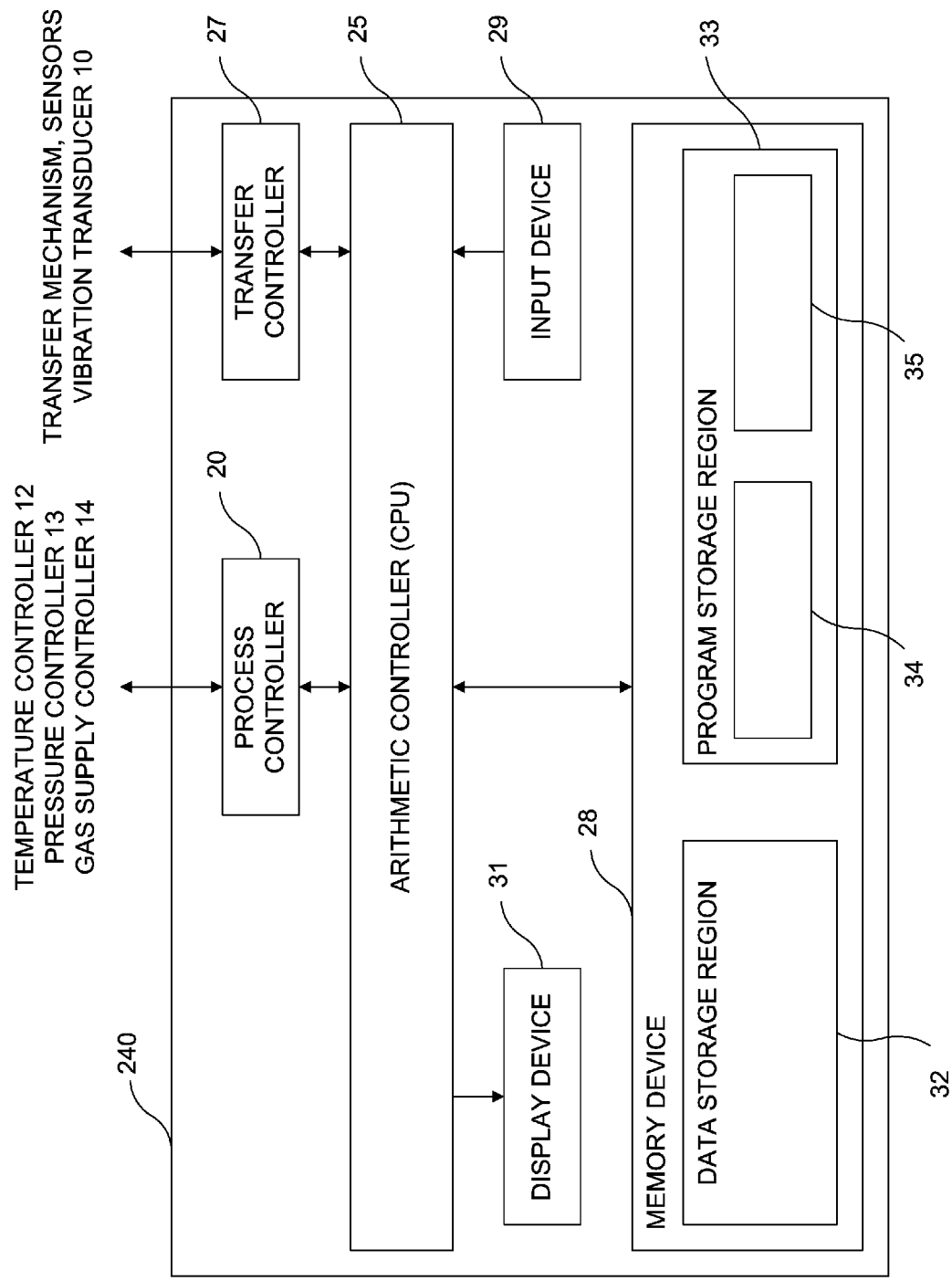
FIG. 4 illustrates a controller of the substrate processing apparatus preferably used in the embodiments.

The apparatus controller 240 configured to control the operation of the substrate processing apparatus 100 will be described with reference to FIG. 4. Hereinafter, the apparatus controller 240 configured to control the operation of the substrate processing apparatus 100 is simply referred to as the controller 240.

The controller 240 mainly includes a CPU (Central Processing Unit) 25 serving as an arithmetic controller, a process controller 20 serving as a process control device, a transfer controller 27 serving as the transfer control mechanism (transfer controller) 11, a memory device 28 having a memory (ROM) 35 and a memory (RAM), an input device 29 such as a mouse and a keyboard and a display device 31 such as a monitor. The memory (ROM) 35 may include a hard disk drive (HDD). The CPU 25, the memory device 28, the input device 29 and the display device 31 constitute an operation device capable of setting respective data.

The CPU 25 forms a backbone of the controller 240. The CPU 25 is configured to execute a control program stored in the ROM 35 and a recipe (such as a process recipe serving as a substrate processing recipe) stored in the memory device 28 functioning as a recipe storage device according to an instruction from the display device 31. The ROM 35 is a recording medium configured to store data such as an operating system for the CPU 25, and may be embodied by components such as an EEPROM, a flash memory and a hard disk. The memory (RAM) functions as a work area (temporary storage device) of the CPU 25.

In the present specification, the term "substrate processing recipe" refers to a recipe in which information such as processing conditions and processing sequences for processing the wafer 200 is stored. Information such as a pre-set value (control value) or a transmission timing to be transmitted to components such as the transfer control mechanism (transfer controller) 11, the temperature controller 12, the pressure controller 13 and the gas supply controller 14 is stored in the recipe, for each step of the substrate processing. The recipe may be also referred to as a "recipe file".

The process controller 20 is configured to control parameters such as an inner temperature and an inner pressure of the process furnace 202 and the flow rate of the process gas supplied into the process furnace 202 in order to process the wafer 200 loaded in the process furnace 202.

The transfer controller 27 is configured to control the operation of the transfer mechanism configured to transfer the wafer 200 such as the rotatable pod shelf 105, the wafer transport mechanism 125 and the boat elevator 115 via a drive motor (not shown).

The memory device 28 has a data storage region 32 where various data is stored and a program storage region 33 where various programs such as the substrate processing recipe are stored.

Various parameters related to the recipe file are stored in the data storage region 32. Carrier information including at least the carrier ID of the pod 110 and the type information of the wafer 200 in the pod 110 is stored in the data storage region 32. The carrier ID refers to information to identify the pod 110. In the embodiments, at least natural vibration frequency information including a natural frequency of the wafer 200, a natural frequency of the boat 217 and a natural frequency of the tweezers 125c is stored in the data storage region 32. The natural frequencies are appropriately measured in advance in accordance with the object whose vibration is to be monitored, and are stored as the natural vibration frequency information in advance in the data storage region 32 appropriately.

Various programs such as the substrate processing recipe required for controlling the operation of the substrate processing apparatus 100 are stored in the program storage region 33. For example, a program such as a vibration detection program 34 is stored in the program storage region 33. The vibration detection program 34 is configured to monitor the vibration of the object to be monitored such as the wafer 200 and the transfer mechanism by detecting the frequency (vibration frequency) of the object by the vibration sensor 1. For example, the vibration detection program 34 is configured to monitor the vibration of the object whose frequency lies in the vicinity of the natural frequency of the wafer 200 to be processed by the substrate processing apparatus 100. That is, the vibration detection program 34 is configured to monitor the vibration of the object whose frequency lies within a monitoring band centered on the natural frequency of the wafer 200. The vibration detection program 34 will be described later in detail.

A touch panel is provided in the display device 31 of the controller 240. The touch panel is configured to display an operation screen configured to receive input of an operation command for the transfer mechanism and the substrate processing system described above. The operation screen includes various display fields and operation buttons for confirming the state of the transfer mechanism and the substrate processing system and for inputting operation instructions to the transfer mechanism and the substrate processing system. The operation device described above preferably includes at least the display device 31 and the input device 29. The operation device may be, for example, an operating terminal device such as a computer and a mobile terminal device.

The transfer control mechanism (transfer controller) 11 is configured to control each of the transfer operations of the rotatable pod shelf 105, the boat elevator 115, the pod transfer device 118, the wafer transport mechanism 125, the boat 217 and the rotating mechanism 254, which constitute the transfer mechanism configured to transfer the wafer 200. Sensors (not shown) are embedded in the rotatable pod shelf 105, the boat elevator 115, the pod transfer device 118, the wafer transport mechanism 125, the boat 217 and the rotating mechanism 254, respectively. The transfer control mechanism (transfer controller) 11 is also configured to notify the controller 240 of the values detected by the sensors (not shown) when a predetermined value and an abnormal value are detected by the sensors. In particular, in the embodiments, the vibration sensor 1 may be provided at the wafer transport mechanism 125 (for example, at the tweezers 125c) and the rotating mechanism 254 described above, respectively.

The temperature controller 12 is configured to adjust the inner temperature of the process furnace 202 by controlling the temperature of the heater 206 of the process furnace 202. The temperature controller 12 is also configured to notify the controller 240 of the values detected by the temperature sensor 263 when a predetermined value and an abnormal value are detected by the temperature sensor 263.

The pressure controller 13 is configured to control the pressure adjusting device 242 based on the pressure detected by the pressure sensor 245 such that the inner pressure of the process chamber 201 is at a desired pressure at a desired timing. The pressure controller 13 is also configured to notify the controller 240 of the values detected by the pressure sensor 245 when a predetermined value and an abnormal value are detected by the pressure sensor 245.

The gas supply controller 14 is configured to control the MFCs 241a and 241b such that the flow rate of the gas supplied into the process chamber 201 is at a desired flow rate at a desired timing. The gas supply controller 14 is also configured to notify the controller 240 of the values detected by the sensors (not shown) provided at the MFCs 241a and 241b when a predetermined value and an abnormal value are detected by the sensors (not shown) provided at the MFCs 241a and 241b.

(6) Vibration Detection System (First Embodiment)

A vibration detection system will be described with reference to FIG. 5.

Figure 5:
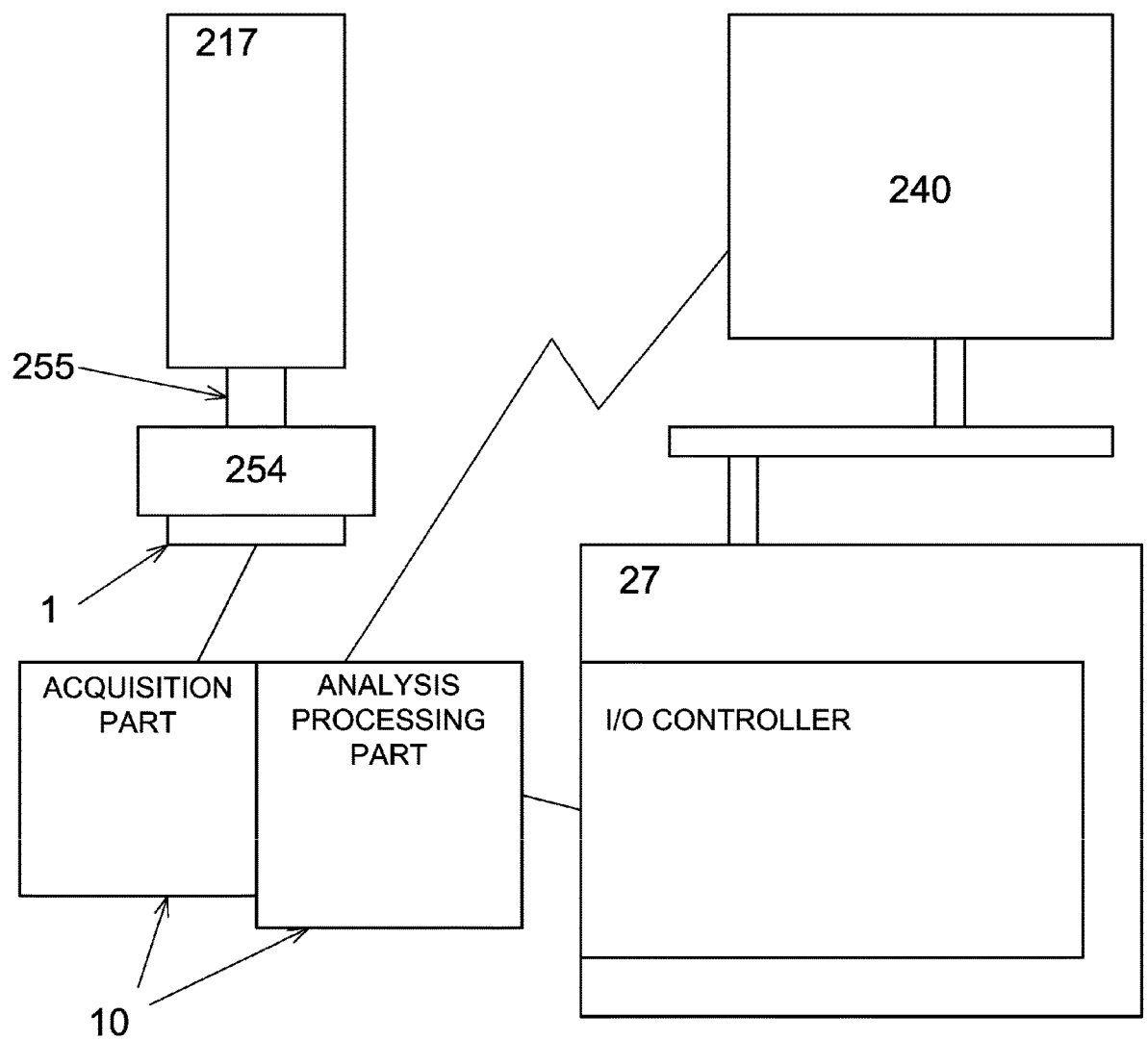
FIG. 5 illustrates a vibration detection system preferably used in the embodiments.

As shown in FIG. 5, the vibration detection system according to the embodiments includes: the transfer mechanism provided with the vibration sensor 1 configured to detect the vibration; a vibration transducer 10 configured to transform detection data (hereinafter, also referred to as "vibration signal") detected by the vibration sensor 1 and to transmit the transformed data (hereinafter, also referred to as "vibration information") to the controller 240; and the controller 240 configured to receive the transformed data transmitted from the vibration transducer 10, to compare a specified part of the transformed data corresponding to the natural frequency band of the wafer 200 (that is, the monitoring band centered on the natural frequency of the wafer 200) and a threshold value (a value indicating an intensity of the vibration), and to determine whether or not the frequency of the transformed data is equal to the natural frequency of the wafer 200 when the transformed data exceeds the threshold value. In the embodiments, the transformed data is represented by a frequency spectrum containing the frequency (vibration frequency) and the intensity of the vibration. The intensity of the vibration may be the magnitude of the acceleration (indicated by a vertical axis of a right side graph shown in FIG. 12 described later), may be the magnitude of the velocity obtained by integrating the transformed data once, or may be the magnitude of the displacement obtained by integrating the transformed data twice. Hereinafter, in the present specification, the intensity of vibration will be described as the acceleration (that is, the magnitude of the acceleration).

As shown in FIG. 5, the vibration transducer 10 at least includes an acquisition part configured to acquire the detection data detected by the vibration sensor 1 through sampling process and an analysis processing part configure to receive the detection data from the acquisition part for each sampling period and to obtain the transformed data by transforming the detection data. In addition, the analysis processing part is configured to periodically transmit a specified part of the transformed data corresponding to the frequency band of a target frequency to be monitored (for example, the natural frequency) to the controller 240. The transformed data may be transmitted to a data collection part (not shown) provided separately from the controller 240.

Figure 12:
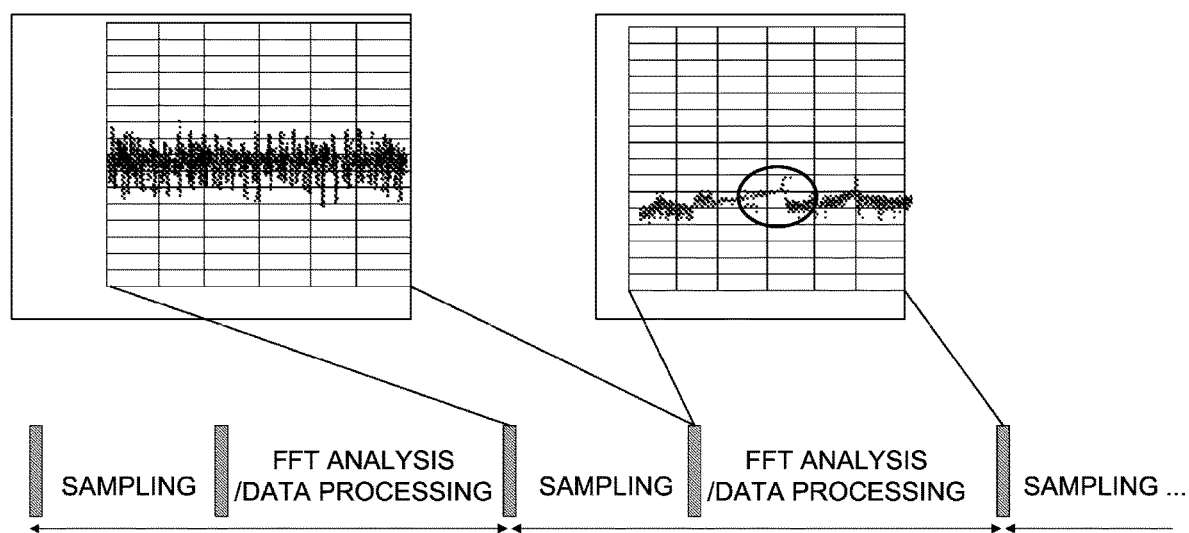
FIG. 12 illustrates an operation of a vibration transducer preferably used in the vibration detection system described herein.

The detection data detected by the vibration sensor 1 and the transformed data obtained by transforming the detection data by FFT (fast Fourier transform) will be described with reference to FIG. 12. The left side graph in FIG. 12 illustrates waveform data detected by the vibration sensor 1, where the horizontal axis of the left side graph in FIG. 12 represents time and the vertical axis of the left side graph in FIG. 12 represents the intensity (unit: voltage) of the vibration signal. The right side graph in FIG. 12 illustrates the transformed data obtained by using the FFT as a frequency spectrum. The horizontal axis of the right side graph in FIG. 12 represents the frequency, and the vertical axis of the right side graph in FIG. 12 represents the intensity (unit: acceleration) of the frequency. The intensity (magnitude) of the frequency represents the intensity of the vibration. The region surrounded by a circle in the right side graph in FIG. 12 indicates the monitoring band (natural frequency monitoring band). The natural frequency monitoring band is from a lower limit frequency 15 Hz lower than the natural frequency of the object to be monitored to an upper limit frequency 15 Hz higher than the natural frequency of the object. In the present specification, the specified part of the transformed data corresponding to the natural frequency monitoring band is also referred to as "vibration frequency data". Hereinafter, in the embodiments, the intensity of the vibration will be described as the magnitude of the acceleration. However, the intensity of the vibration may also be the magnitude of the velocity obtained by integrating the vibration frequency data once or the magnitude of the displacement obtained by integrating the vibration frequency data twice.

The vibration transducer 10 (that is, the analysis processing part) collects the detection data as the vibration signal for a certain period and performs FFT analysis on the detection data for a predetermined number of sampling points. After the completion of the FFT analysis, the analysis processing part calculates the transformed data obtained by the FFT analysis in the predetermined natural frequency monitoring band or the specified value of the transformed data such as maximum value or average value, and transmits the transformed data or the specified value to the controller 240. For example, a series of operations from the sampling to the transmission to the controller 240 is performed cyclically within the operation period of the transfer mechanism. Data after the FFT analysis is transmitted to the controller 240 in real time, or is transmitted to the controller 240 after being accumulated to some extent (for example, after the FFT analysis is performed 10 times). The time during which the analysis processing part is analyzing and processing the detection data is the non-monitoring time.

As an example of the sampling process of the acquisition part from the vibration sensor 1, the sampling period is 200 μS (20 KHz), the sampling time is the operation time of the transport mechanism (for example, 1 minute) and the sampling number is 300,000 times. In addition, about 1,000 data are processed in one FFT analysis.

Analog data such as the specified value in the natural frequency band of the transformed data calculated from the detection data detected by the vibration sensor 1 may be transmitted to the controller 240 via an I/O controller provided in the transfer controller 27 shown in FIG. 5. For example, the analog data may be read by an upper controller such as the controller 240 via an I/O controller. When the I/O controller can only transmit one item, that is, one data (2 bytes) per second, the analog data other than the specified value to be transmitted to the controller 240 (for example, the number of times exceeding the threshold value or a level value) is appropriately determined according to the processing content of the analysis processing part. The analog data may also be transmitted directly from the analysis processing part to the controller 240 without the I/O controller.

As shown in FIG. 5, the vibration sensor 1 is provided under the rotating mechanism 254. The vibration sensor 1 is configured to detect the vibration from the outside while the rotating mechanism 254 operates to rotate the boat 217. As shown in FIG. 11, the vibration sensor 1 may be provided in the vicinity of the tweezers 125c (of the wafer transport mechanism 125) to detect the vibration, or the vibration sensor 1 may be provided at both of the rotating mechanism 254 and the wafer transport mechanism 125 to detect the vibration.

Figure 6:
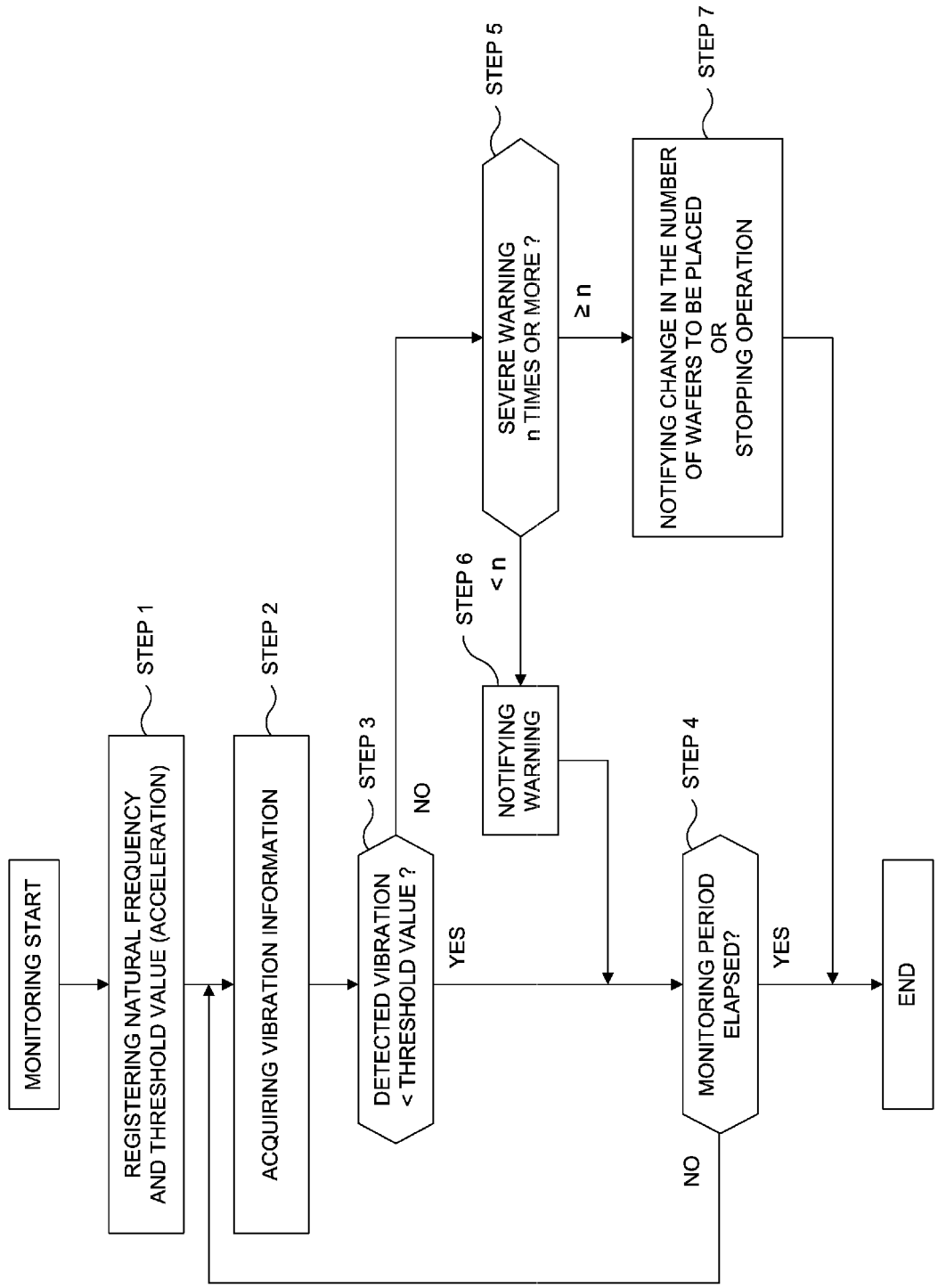
FIG. 6 illustrates a flow of a vibration detection program executed by the controller in the vibration detection system preferably used in a first embodiment described herein.

Hereinafter, a flow of the vibration detection program 34 executed by the controller 240 in the vibration detection system will be described with reference to FIG. 6. The CPU 25 of the controller 240 serves as a monitoring part.

The natural frequency of the wafer 200 and the threshold value (the magnitude of acceleration) stored in advance in the data storage region 32 are registered (STEP 1). The natural frequency of the wafer 200 is measured in advance before starting the monitoring and stored in the data storage region 32.

The vibration sensor 1 detects the vibration, and the vibration signal is acquired. Then, the analysis processing part transforms the vibration signal into the vibration information indicated by the frequency spectrum by performing the FFT analysis based on the predetermined sampling number, and transmits the vibration information corresponding to the natural frequency monitoring band in the frequency spectrum to the controller 240 (STEP 2).

The controller 240 determines whether the intensity of the vibration exceeds the threshold value based on the transmitted vibration information (STEP 3). When the intensity of the vibration is less than or equal to the threshold value, the controller 240 determines that the vibration is a slight vibration which hardly causes any trouble in the transfer operation, and determines whether the monitoring period has elapsed (STEP 4). When the monitoring period has not elapsed, the controller 240 performs the detection of the vibration by the vibration sensor 1 (STEP 2) and the determination of whether the intensity of the vibration exceeds the threshold value (STEP 3) repeatedly. When the monitoring period has elapsed, the controller 240 terminates the vibration detection program 34.

When the intensity of the vibration exceeds the threshold value in STEP 3, the controller 240 determines that a severe vibration is occurring. Specifically, the controller 240 determines that the vibration frequency calculated from the detection data detected by the vibration sensor 1 is equal to the natural frequency of the wafer 200, and as a result the resonance state is reached and the acceleration increases. Then, the controller 240 determines whether or not a severe vibration occurrence frequency (that is, the number of times of exceeding the threshold value) reaches a predetermined number of times (n times) (STEP 5). When the severe vibration occurrence frequency is less than the predetermined number of times, the controller 240 notifies a warning (STEP 6), and returns to STEP 4. When the severe vibration occurrence frequency reaches the predetermined number of times, the controller 240 notifies the transfer mechanism to change the number of the wafers to be placed on the transfer mechanism in the next transfer operation (STEP 7). Alternatively, the controller 240 stops the operation of the transfer mechanism provided with the vibration sensor 1 (STEP 7). When the controller 240 notifies the transfer mechanism to change the number of wafers in STEP 7, the operation of the transfer mechanism may be continued without stopping the operation of the transfer mechanism. After proceeding to STEP 7, the vibration detection program 34 is terminated.

According to the first embodiment, by monitoring the occurrence of the vibration in the vicinity of the natural frequency of the wafer 200, it is possible to grasp the signs of the deviation of the wafer 200.

According to the first embodiment, when the number of times that the vibration frequency is found to be equal to the natural frequency of the wafer 200 is less than the predetermined number of times, the operation of the transfer mechanism can be continued without stopping. Therefore, it is possible to suppress the decrease in the apparatus operation rate.

Second Embodiment

Figure 7:
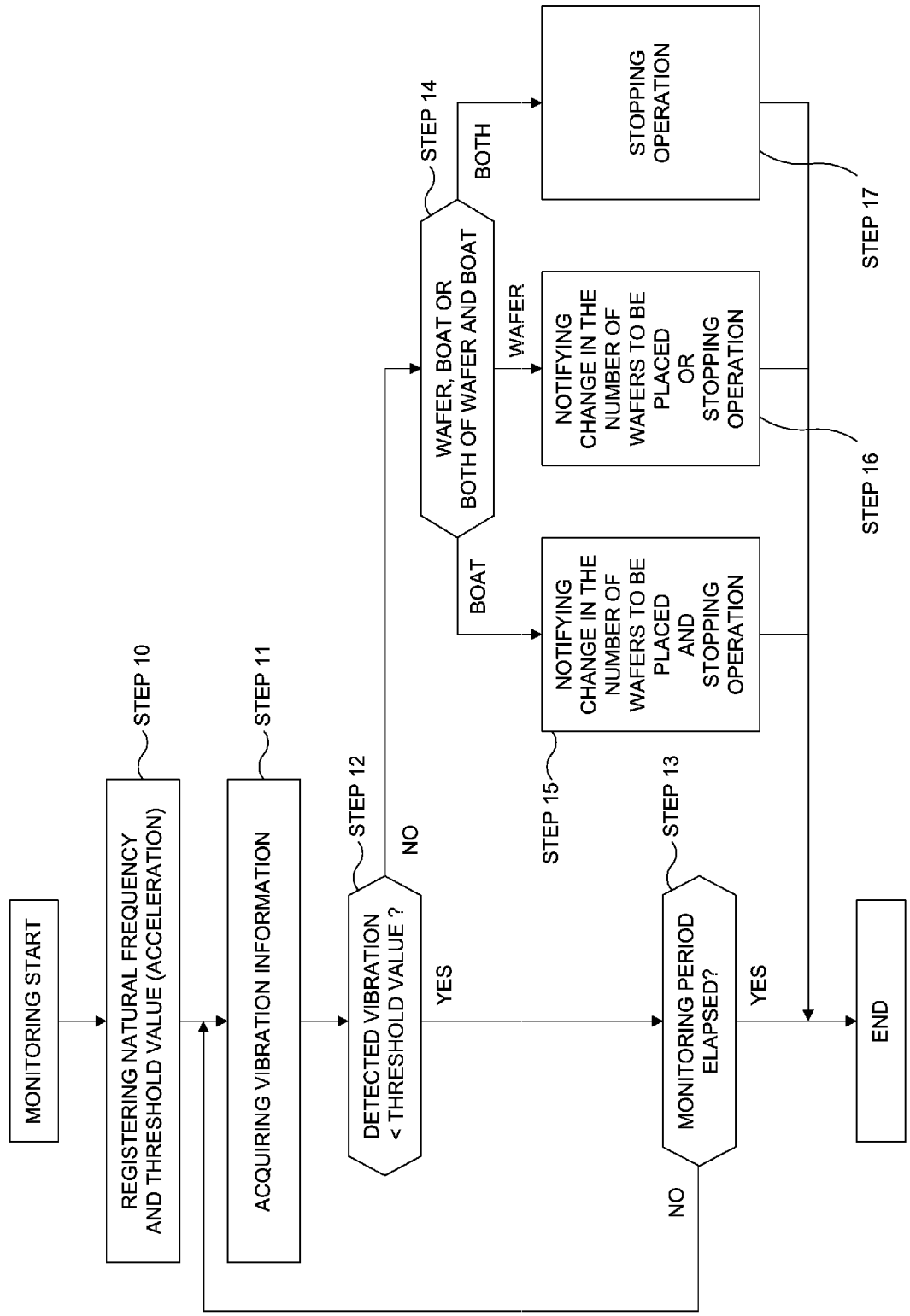
FIG. 7 illustrates another flow of the vibration detection program executed by the controller in the vibration detection system preferably used in a second embodiment described herein.

Hereinafter, a flow of the vibration detection program 34 executed by the controller 240 in the vibration detection system shown in FIG. 5 will be described with reference to FIG. 7.

The natural frequency of each of the wafer 200 and the boat 217 and the threshold value (acceleration) of each of the wafer 200 and the boat 217 stored in advance in the data storage region 32 are registered, respectively (STEP 10). The natural frequencies of the wafer 200 and the boat 217 are measured in advance before starting the monitoring and stored in the data storage region 32.

The vibration sensor 1 detects the vibration, and the vibration signal is acquired. Then, the analysis processing part transforms the vibration signal into the vibration information indicated by the frequency spectrum by performing the FFT analysis based on the predetermined sampling number, and transmits the vibration information corresponding to the natural frequency monitoring band in the frequency spectrum to the controller 240 (STEP 11).

The controller 240 determines whether the vibration frequency is equal to the natural frequency of the wafer 200 or the boat 217 based on the transmitted vibration information by determining whether the intensity of the vibration (acceleration) exceeds the threshold value of the wafer 200 or the boat 217 based on the transmitted vibration information (STEP 12). When the intensity of the vibration is less than or equal to the threshold value, the controller 240 determines that the vibration is a slight vibration that hardly causes any trouble in the transfer operation, and determines whether the monitoring period has elapsed (STEP 13). When the monitoring period has not elapsed, the controller 240 performs the detection of the vibration by the vibration sensor 1 (STEP 11) and the determination of whether the intensity of the vibration exceeds the threshold values (STEP 12) repeatedly. When the monitoring period has elapsed, the controller 240 terminates the vibration detection program 34.

When the intensity of the vibration exceeds the threshold values in STEP 12, the controller 240 determines that the vibration frequency based on the vibration information calculated from the vibration signal of the vibration sensor 1 is equal to the natural frequency of the wafer 200 and as a result the wafer 200 has reached its resonance state, or the vibration frequency is equal to the natural frequency of the boat 217 and as a result the boat 217 has reached its resonance state, or the vibration frequency is equal to the natural frequency of both of the wafer 200 and the boat 217 and as a result both of the wafer 200 and the boat 217 have reached their resonance states (STEP 14). When the controller 240 determines that the vibration frequency is equal to the natural frequency of both of the wafer 200 and the boat 217 and as a result their resonance states are reached, the controller 240 stops the operation of the transfer mechanism provided with the vibration sensor 1 (STEP 17). When the controller 240 determines that the vibration frequency is equal to the natural frequency of the boat 217 and as a result its resonance state is reached, the controller 240 stops the operation of the transfer mechanism provided with the vibration sensor 1 and notifies the transfer mechanism to change the number of the wafers to be placed on the transfer mechanism in the next transfer operation (STEP 15). When the controller 240 determines that the vibration frequency is equal to the natural frequency of the wafer 200 and as a result its resonance state is reached, the controller 240 notifies the transfer mechanism to change the number of the wafers to be placed on the transfer mechanism in the next transfer operation (STEP 16) or the controller 240 stops the operation of the transfer mechanism provided with the vibration sensor 1 (STEP 16).

When the controller 240 notifies the transfer mechanism to change the number of wafers in STEP 16, the operation of the transfer mechanism may be continued without stopping. After proceeding to STEP 15, STEP 16 or STEP 17, the vibration detection program 34 is terminated.

Similar to the first embodiment, the controller 240 may determine that whether or not the severe vibration occurrence frequency (that is, the number of times of exceeding the threshold values) reaches the predetermined number of times (n times) in STEP 16. When the severe vibration occurrence frequency is less than the predetermined number of times, the controller 240 notifies a warning, and returns to STEP 13. When the severe vibration occurrence frequency reaches the predetermined number of times, the controller 240 may be configured to stop the operation of the transfer mechanism and terminate the vibration detection program 34.

According to the second embodiment, by monitoring the occurrence of the vibration whose frequency lies in the vicinity of the natural frequency of the wafer 200 or the boat 217, it is possible to grasp the signs of the deviation of the wafer 200. In addition, it is possible to reduce the risk of the wafer 200 falling off or falling down due to the vibration of the boat 217.

According to the second embodiment, by monitoring the occurrence of the vibration whose frequency lies in the vicinity of the natural frequency of the wafer 200 or the boat 217, it is possible to avoid the risk of the vibration of the boat 217 by changing the number of wafers placed on the boat 217 (that is, the number of wafers to be loaded in the boat 217) in the next transfer operation so that the vibration frequency stays away from the natural frequency of the boat 217.

According to the second embodiment, when the number of times that the vibration frequency is found to be equal to the natural frequency of the wafer 200 or the boat 217 is less than the predetermined number of times, the rotation of the boat 217 can be continued without stopping. Therefore, it is possible to avoid the loss of the wafer 200 accommodated in the boat 217. It is also possible to suppress the decrease in the apparatus operation rate.

Third Embodiment

Figure 8:
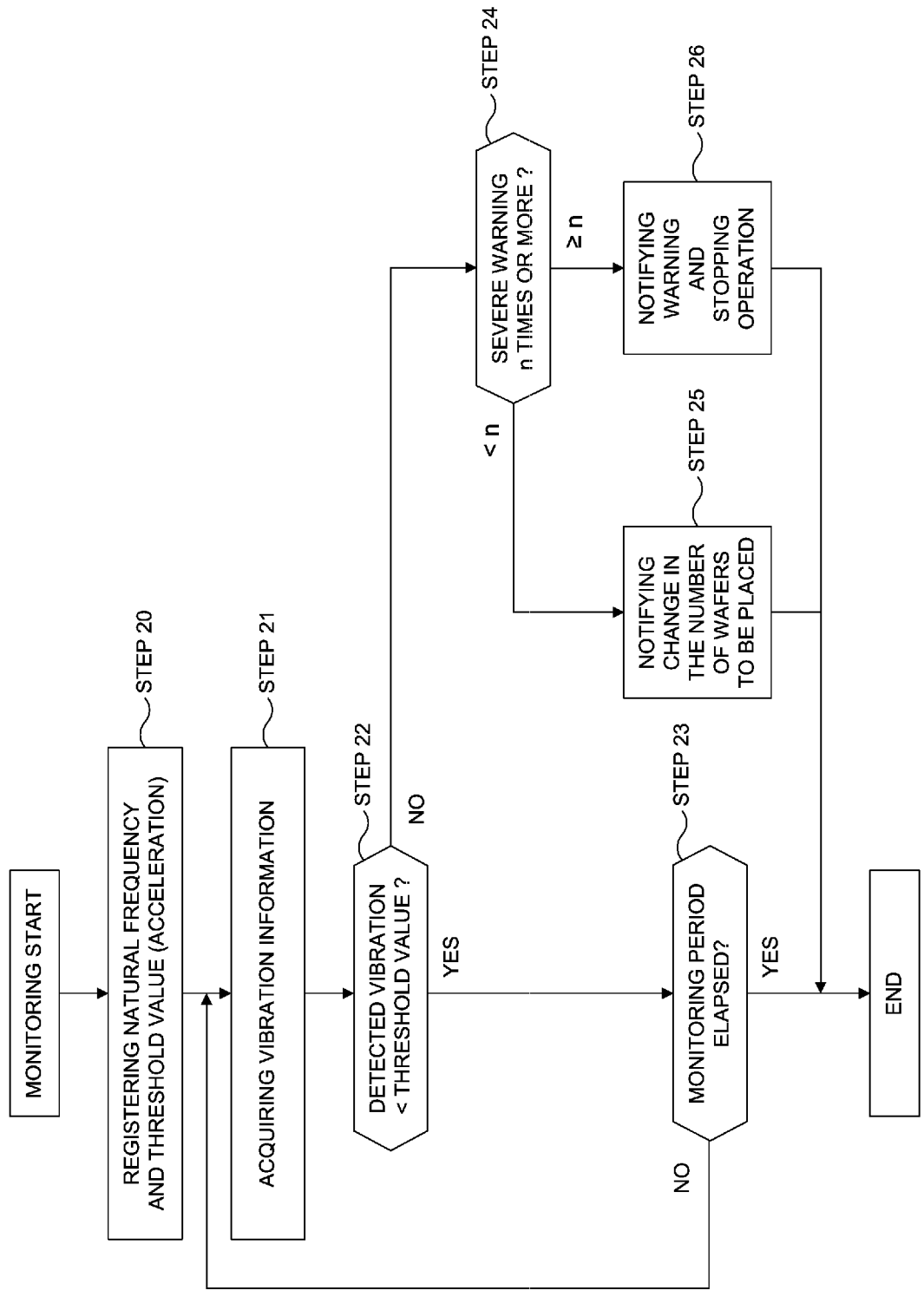
FIG. 8 illustrates still another flow of the vibration detection program executed by the controller in the vibration detection system preferably used in a third embodiment described herein.

Hereinafter, a flow of the vibration detection program 34 executed by the controller 240 in the vibration detection system shown in FIG. 5 will be described with reference to FIG. 8.

The natural frequency of the boat 217 and the threshold value (the magnitude of acceleration) of the boat 217 stored in advance in the data storage region 32 are registered (STEP 20). The natural frequency of the boat 217 is measured in advance before starting the monitoring and stored in the data storage region 32.

The vibration sensor 1 detects the vibration, and the vibration signal is acquired. Then, the analysis processing part transforms the vibration signal into the vibration information indicated by the frequency spectrum by performing the FFT analysis based on the predetermined sampling number, and transmits the vibration information corresponding to the natural frequency monitoring band in the frequency spectrum to the controller 240 (STEP 21).

The controller 240 determines whether the intensity of the vibration exceeds the threshold value based on the transmitted vibration information (STEP 22). When the intensity of the vibration is less than or equal to the threshold value, the controller 240 determines that the vibration is a slight vibration that hardly causes any trouble in the transfer operation, and determines whether the monitoring period has elapsed (STEP 23). When the monitoring period has not elapsed, the controller 240 performs the detection of the vibration by the vibration sensor 1 (STEP 21) and the determination of whether the intensity of the vibration exceeds the threshold value (STEP 22) repeatedly. When the monitoring period has elapsed, the controller 240 terminates the vibration detection program 34.

When the intensity of the vibration exceeds the threshold value in STEP 22, the controller 240 determines that a severe vibration is occurring. Specifically, the controller 240 determines that the vibration frequency based on the vibration information calculated from the vibration signal of the vibration sensor 1 is equal to the natural frequency of the boat 217 and as a result the boat 217 has reached its resonance state and the acceleration increases. Then, the controller 240 determines whether or not the severe vibration occurrence frequency (that is, the number of times of exceeding the threshold value) reaches a predetermined number of times (n times) (STEP 24). When the severe vibration occurrence frequency reaches the predetermined number of times, the controller 240 notifies a warning of the deviation of the wafer 200 and stops the operation of the transfer mechanism provided with the vibration sensor 1 (STEP 26). When the severe vibration occurrence frequency is less than the predetermined number of times, the controller 240 notifies the transfer mechanism to change the number of the wafers to be placed on the boat 217 (that is, the number of the wafers to be loaded in the boat 217) in the next transfer operation (STEP 25). When the controller 240 notifies the transfer mechanism to change the number of wafers in STEP 25, the operation of the boat 217 may be continued without stopping. After proceeding to STEP 25 or STEP 26, the vibration detection program 34 is terminated.

According to the third embodiment, by monitoring the occurrence of the vibration whose frequency lies in the vicinity of the natural frequency of the boat 217, it is possible to grasp the signs of the deviation of the wafer 200. In addition, it is possible to reduce the risk of the wafer 200 falling off or falling down due to the vibration of the boat 217.

According to the third embodiment, by monitoring the occurrence of the vibration whose frequency lies in the vicinity of the natural frequency of the boat 217, it is possible to avoid the risk of the vibration of the boat 217 by changing the number of wafers to be loaded in the boat 217 in the next transfer operation so that the vibration frequency stays away from the natural frequency of the boat 217.

According to the third embodiment, when the number of times that the vibration frequency is found to be equal to the natural frequency of the boat 217 is less than the predetermined number of times, the rotation of the boat 217 can be continued without stopping. Therefore, it is possible to avoid the loss of the wafer 200 accommodated in the boat 217. It is also possible to suppress the decrease in the apparatus operation rate.

Fourth Embodiment

Figure 9:
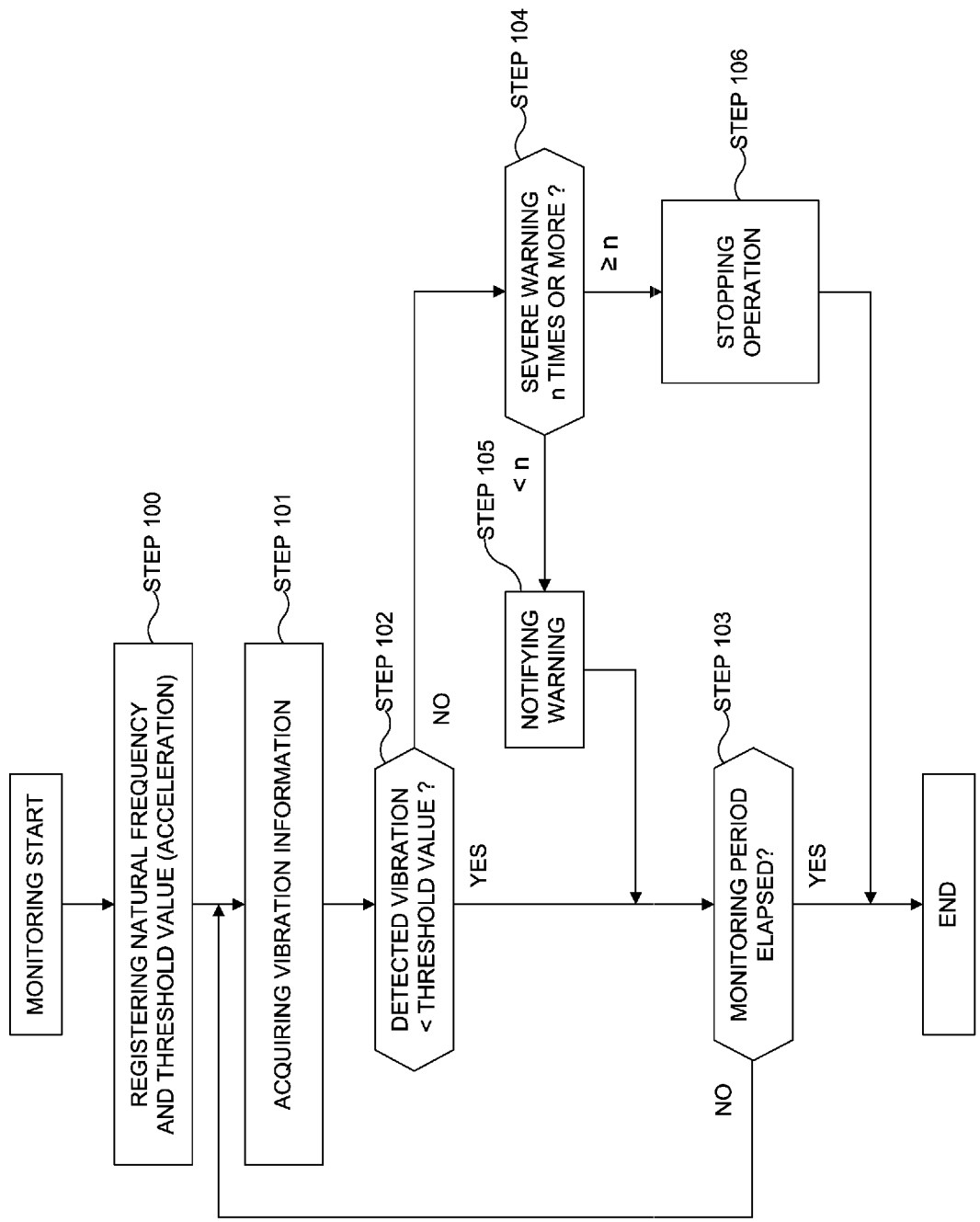
FIG. 9 illustrates still another flow of the vibration detection program executed by the controller in the vibration detection system preferably used in a fourth embodiment described herein.

Hereinafter, a flow of the vibration detection program 34 executed by the controller 240 in the vibration detection system shown in FIG. 5 will be described with reference to FIG. 9. The vibration detection program 34 is executed while the wafers including the wafer 200 are transported from the pod 110 to the boat 217 by the wafer transport mechanism 125 or while the processed wafers including the wafer 200 are transported from the boat 217 to the pod 110 by the wafer transport mechanism 125.

The natural frequency of the wafer transport mechanism 125 (for example, the natural frequency of the tweezers 125c) and the threshold value (acceleration) of the wafer transport mechanism 125 (the tweezers 125c) stored in advance in the data storage region 32 are registered (STEP 100). The natural frequency of the wafer transport mechanism 125 (the tweezers 125c) is measured in advance before starting the monitoring and stored in the data storage region 32.

The vibration sensor 1 detects the vibration, and the vibration signal is acquired. Then, the analysis processing part transforms the vibration signal into the vibration information indicated by the frequency spectrum by performing the FFT analysis based on the predetermined sampling number, and transmits the vibration information corresponding to the natural frequency monitoring band in the frequency spectrum to the controller 240 (STEP 101).

The controller 240 determines whether the intensity of the vibration exceeds the threshold value based on the transmitted vibration information (STEP 102). When the intensity of the vibration is less than or equal to the threshold value, the controller 240 determines that the vibration is a slight vibration that hardly causes any trouble in the transfer operation, and determines whether the monitoring period has elapsed (STEP 103). When the monitoring period has not elapsed, the controller 240 performs the detection of the vibration by the vibration sensor 1 (STEP 101) and the determination of whether the intensity of the vibration exceeds the threshold value (STEP 102) repeatedly. When the monitoring period has elapsed, the controller 240 terminates the vibration detection program 34.

When the intensity of the vibration exceeds the threshold value in STEP 102, the controller 240 determines that a severe vibration is occurring. Specifically, the controller 240 determines that the vibration frequency based on the vibration information calculated from the vibration signal of the vibration sensor 1 is equal to the natural frequency of the wafer 200 and as a result the wafer 200 has reached its resonance state, which increases the acceleration. Then, the controller 240 determines that whether or not the severe vibration occurrence frequency (that is, the number of times of exceeding the threshold value) reaches a predetermined number of times (n times) (STEP 104). When the severe vibration occurrence frequency is less than the predetermined number of times, the controller 240 notifies a warning of the deviation of the wafer 200 (STEP 105), and returns to STEP 103. When the severe vibration occurrence frequency reaches the predetermined number of times, the controller 240 stops the operation of the wafer transport mechanism 125 (the tweezers 125c) provided with the vibration sensor 1 (STEP 106). After proceeding to STEP 106, the vibration detection program 34 is terminated.

According to the fourth embodiment, by monitoring the occurrence of the vibration whose frequency lies in the vicinity of the natural frequency of the wafer transport mechanism 125 (the tweezers 125c), it is possible to grasp the signs of the deviation of the wafer 200.

According to the fourth embodiment, it is possible to reduce the risk of the wafer 200 falling off or falling down due to the vibration of the wafer transport mechanism 125 (the tweezers 125c). It is also possible to reduce the particles due to the deviation of the wafer 200.

Fifth Embodiment

Figure 10:
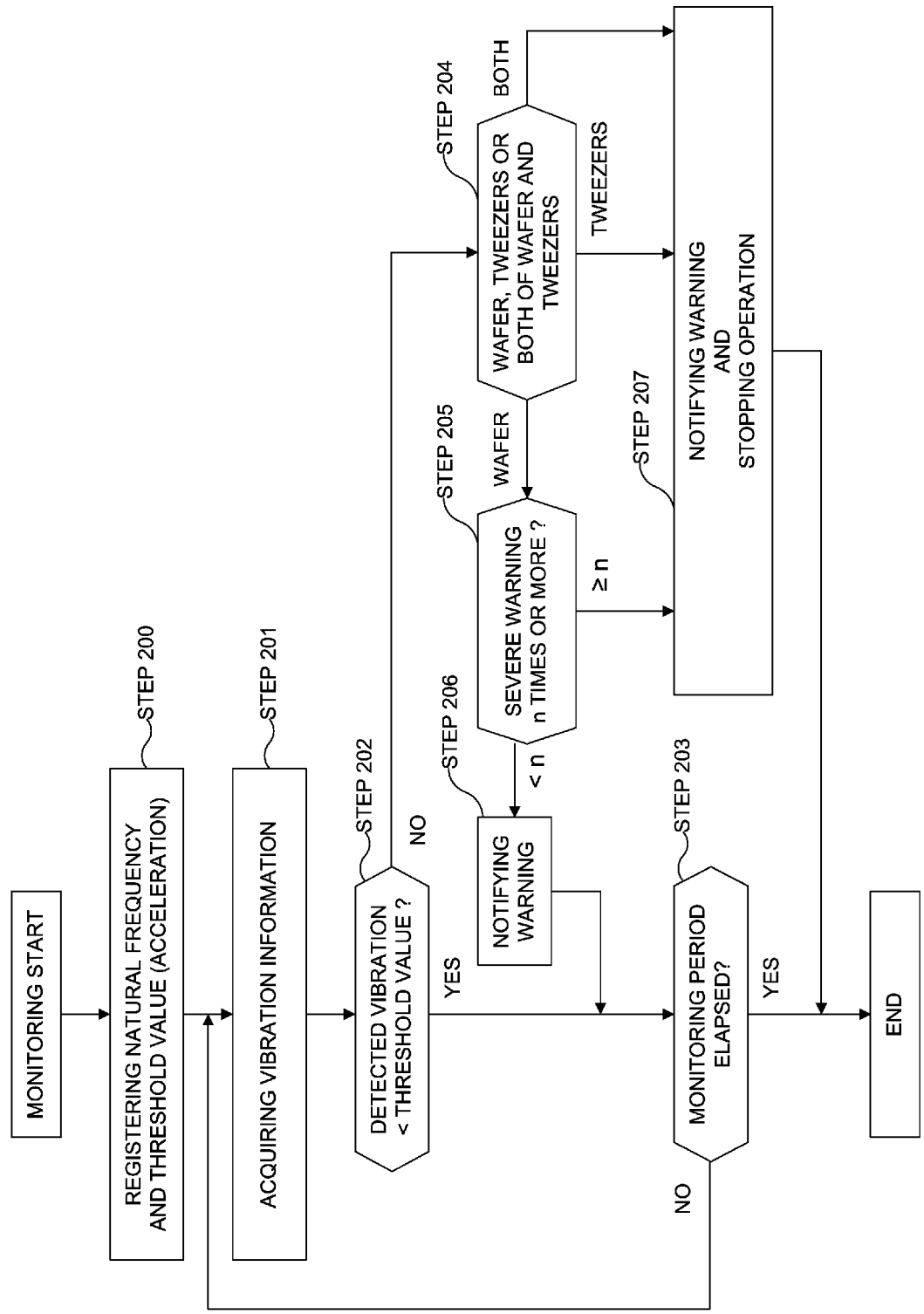
FIG. 10 illustrates still another flow of the vibration detection program executed by the controller in the vibration detection system preferably used in a fifth embodiment described herein.

Hereinafter, a flow of the vibration detection program 34 executed by the controller 240 in the vibration detection system shown in FIG. 5 will be described with reference to FIG. 10. The vibration detection program 34 is executed while the wafers including the wafer 200 are transported from the pod 110 to the boat 217 by the wafer transport mechanism 125.

The natural frequency of each of the wafer 200 and the wafer transport mechanism 125 (for example, the tweezers 125c) and the threshold value (acceleration) of each of the wafer 200 and the wafer transport mechanism 125 (the tweezers 125c) stored in advance in the data storage region 32 are registered, respectively (STEP 200). The natural frequencies of the wafer 200 and the wafer transport mechanism 125 (the tweezers 125c) are measured in advance before starting the monitoring and stored in the data storage region 32.

The vibration sensor 1 detects the vibration, and the vibration signal is acquired. Then, the analysis processing part transforms the vibration signal into the vibration information indicated by the frequency spectrum by performing the FFT analysis based on the predetermined sampling number, and transmits the vibration information corresponding to the natural frequency monitoring band in the frequency spectrum to the controller 240 (STEP 201).

The controller 240 determines whether the intensity of the vibration exceeds the threshold values based on the transmitted vibration information (STEP 202). When the intensity of the vibration is less than or equal to the threshold values, the controller 240 determines that the vibration is a slight vibration that hardly causes any trouble in the transfer operation, and determines whether the monitoring period has elapsed (STEP 203). When the monitoring period has not elapsed, the controller 240 performs the detection of the vibration by the vibration sensor 1 (STEP 201) and the determination of whether the intensity of the vibration exceeds the threshold values (STEP 202) repeatedly. When the monitoring period has elapsed, the controller 240 terminates the vibration detection program 34.

When the intensity of the vibration exceeds the threshold values in STEP 202, the controller 240 determines that the vibration frequency based on the vibration information calculated from the vibration signal of the vibration sensor 1 is equal to the natural frequency of the wafer 200 and as a result the wafer 200 has reached its resonance state, or the vibration frequency is equal to the natural frequency of the tweezers 125c and as a result the tweezers 125c have reached their resonance state, or the vibration frequency is equal to the natural frequencies of both of the wafer 200 and the tweezers 125c and as a result both of the wafer 200 and the tweezers 125c have reached their resonance states (STEP 204). When the controller 240 determines that the vibration frequency is equal to the natural frequencies of both of the wafer 200 and the tweezers 125c and as a result their resonance states are reached or the vibration frequency is equal to the natural frequency of the tweezers 125c and as a result its resonance state is reached, the controller 240 stops the operation of the wafer transport mechanism 125 provided with the vibration sensor 1 and notifies a warning of the deviation of the wafer 200 (STEP 207). When the warning can be canceled with a simple maintenance work by prompting the maintenance work by the warning of STEP 207, it is possible to restart the operation of the wafer transport mechanism 125 and to continue the processing such as the transfer operation. When the controller 240 determines that the vibration frequency is equal to the natural frequency of the wafer 200 and as a result its resonance state is reached, the controller 240 determines the number of times that the vibration frequency is found to be equal to the natural frequency of the wafer 200 (STEP 205).

When the number of times that the vibration frequency is found to be equal to the natural frequency of the wafer 200 is less than a predetermined number of times, the controller 240 notifies a warning of the deviation of the wafer 200 (STEP 206), and returns to STEP 203. Then, the controller 240 performs the detection of the vibration by the vibration sensor 1 (STEP 201) and the determination of whether the intensity of the vibration exceeds the threshold values (STEP 202) repeatedly. When the monitoring period has elapsed (STEP 203), the controller 240 terminates the vibration detection program 34. When the number of times that the vibration frequency is found to be equal to the natural frequency of the wafer 200 reaches the predetermined number of times, the controller 240 stops the operation of the wafer transport mechanism 125 provided with the vibration sensor 1 and notifies a warning of the deviation of the wafer 200 (STEP 207). This prompts the maintenance work by notifying the warning of STEP 207. Then, the controller 240 terminates the vibration detection program 34.

Similar to the fourth embodiment, when the number of times that the vibration frequency is found to be equal to the natural frequency of the tweezers 125c is less than a predetermined number of times, the controller 240 may notify a warning of the deviation of the wafer 200 and continue the transfer operation of the wafer transport mechanism 125. When the number of times that the vibration frequency is found to be equal to the natural frequency of the tweezers 125c is equal to or greater than the predetermined number of times, the controller 240 may notify a warning of the deviation of the wafer 200 and stop the transfer operation of the wafer transport mechanism 125.

The wafer transport mechanism 125 is configured to transport the wafers including the wafer 200 from the pod 100 to the boat 217 by performing a series of operation sequences by turning to the boat 217 and advancing, lowering and retreating. The wafer transport mechanism 125 is also configured to transport one or more processed wafers including the wafer 200 from the boat 217 to the predetermined pod 110 by performing a series of operation sequences by turning to the predetermined pod 110 and advancing, lowering and retreating. In the fourth embodiment and the fifth embodiment, the operation of the wafer transport mechanism 125 is stopped after performing the series of operation sequences.

According to the fifth embodiment, by monitoring the occurrence of the vibration whose frequency lies in the vicinity of the natural frequency of the wafer transport mechanism 125 (the tweezers 125c), it is possible to grasp the signs of the deviation of the wafer 200.

According to the fifth embodiment, it is possible to reduce the risk of the wafer 200 falling off or falling down due to the vibration of the wafer transport mechanism 125 (the tweezers 125c). It is also possible to reduce the particles due to the deviation of the wafer 200. Specifically, when the wafer 200 becomes deviated from a predetermined position on the tweezers 125c, it is possible to reduce the risk that the particles are generated due to the friction between the tweezers 125c and the lower surface of the wafer 200.

According to the fifth embodiment, by monitoring the occurrence of the vibration whose frequency lies in the vicinity of the natural frequency of the wafer transport mechanism 125 (the tweezers 125c), it is possible to reduce the risk of the wafer 200 falling off from the fixed point on the boat 217 due to its deviation from the predetermined position on the tweezers 125c when the wafer 200 is transported to the boat 217.

Sixth Embodiment

The timing of the vibration detection program 34 executed by the controller 240 may be different when the vibration sensor 1 is provided at the transfer mechanism according to the first embodiment, the vibration sensor 1 is provided at the rotating mechanism 254 according to the second embodiment and the third embodiment, and the vibration sensor 1 is provided at the tweezers 125c according to the fourth embodiment and the fifth embodiment, respectively. Therefore, in the sixth embodiment, the first embodiment through the fifth embodiment may be appropriately combined. According to the sixth embodiment, the same advantageous effects as the first embodiment through the fifth embodiment may be obtained.

Other Embodiments

While the above-described embodiments are described in detail by way of an example in which the vibration sensor 1 described above is provided at the tweezers 125c or the rotating mechanism 254, the above-described technique is not limited thereto. For example, the vibration sensor 1 may be provided at another transfer mechanism such as the pod transfer device 118.

The controller 240 according to the embodiments is not limited to a dedicated computer system. The controller 240 may be embodied by a general-purpose computer system. For example, the controller 240 may be embodied by preparing an external recording medium such as a USB memory and an external HDD storing a control program for executing the various operations described above, and installing the control program onto the general-purpose computer system using the external recording medium.

There are various ways to provide a program such as the control program. For example, instead of supplying the control program via a predetermined recording medium as described above, the control program may be provided through a communication line, a communication network or a communication system. In addition, the program posted on a bulletin board on the communication network may be received via the communication network. The program may be transmitted by being superimposed on the carrier wave via the communication network. The program may be executed under an operating system (OS) just like any other application programs to perform the above-described processing.

While the embodiments are described in detail using a semiconductor manufacturing apparatus as an example of the substrate processing apparatus, the above-described technique is not limited thereto. For example, the above-described technique can also be applied to an apparatus for processing a glass substrate such as an LCD manufacturing apparatus. For example, the above-described technique can be applied not only to a film-forming process, but also to processes such as an annealing process, an oxidation process, a nitridation process and a diffusion process. For example, the film-forming process may be a process of forming a film such as an oxide film, a nitride film and a metal-containing film.

While the technique is described by way of the above-described embodiments, the above-described technique is not limited thereto. The above-described technique may be modified in various ways without departing from the gist thereof.

The above-described technique can also be applied to an apparatus such as a substrate processing apparatus that monitors whether or not a vibration frequency calculated from a vibration sensor provided at a component of the apparatus is equal to a natural vibration frequency of a substrate processed by the apparatus.

According to the present disclosure, it is possible to reduce the risk of particle generation due to the deviation of the substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a placement part whereon a substrate container is placed;
   a substrate retainer configured to support a substrate accommodated in the substrate container;
   a plurality of transfer mechanisms configured to transfer the substrate between the substrate container and the substrate retainer and to perform a transfer operation;
   a detector provided at one or more of the plurality of transfer mechanisms and configured to detect vibration;
   a memory device configured to register in advance natural frequencies of the substrate and the one or more of the plurality of transfer mechanisms and a threshold value of the substrate and threshold values of the plurality of transfer mechanisms; and
   a monitoring part configured to monitor whether an intensity of the vibration based on transformed data obtained by transforming detection data of the vibration detected by the detector exceeds at least one of the threshold value of the substrate and the threshold values of the plurality of transfer mechanisms and whether a vibration frequency of the vibration based on the transformed data is equal to at least one of the natural frequency of the substrate and the natural frequencies of the plurality of transfer mechanisms.

2. The substrate processing apparatus of claim 1, wherein the monitoring part is further configured to control the detector to continue detecting the vibration when the intensity of the vibration is less than or equal to the threshold value of the substrate.

3. The substrate processing apparatus of claim 1, wherein the monitoring part is further configured to determine number of times that the vibration frequency is found to be equal to the natural frequency of the substrate when the intensity of the vibration exceeds the threshold value of the substrate, to control the detector to continue detecting the vibration when the number of times is less than a predetermined number, and to control the plurality of transfer mechanisms to change the number of substrates placed thereon when the number of times reaches the predetermined number.

4. The substrate processing apparatus of claim 3, wherein the monitoring part is further configured to control the plurality of transfer mechanisms to continue operation even when the number of times reaches the predetermined number.

5. The substrate processing apparatus of claim 3, wherein the monitoring part is further configured to control the detector to terminate detecting the vibration when the number of times reaches the predetermined number.

6. The substrate processing apparatus of claim 1, wherein the monitoring part is further configured to monitor whether the vibration frequency based on the transformed data is equal to the natural frequency of one of the plurality of transfer mechanisms.

7. The substrate processing apparatus of claim 1, further comprising:
   an analysis processing part configured to generate the transformed data by analyzing the detection data of the vibration detected by the detector and to transmit the transformed data corresponding to a monitoring band centered on the natural frequency of the substrate to the monitoring part.

8. The substrate processing apparatus of claim 1, further comprising:
   an analysis processing part configured to generate the transformed data by analyzing the detection data of the vibration detected by the detector and to transmit a specified value of the transformed data comprising a maximum value and an average value corresponding to a monitoring band centered on the natural frequency of the substrate to the monitoring part.

9. A vibration detection system comprising:
   a detector provided at a transfer mechanism and configured to detect vibration while the transfer mechanism is in operation;
   an analysis processing part configured to generate transformed data defined by a vibration frequency and an intensity of the vibration at the vibration frequency by transforming detection data of the vibration detected by the detector;
   a memory device configured to register in advance natural frequencies of the substrate and the one or more of the plurality of transfer mechanisms and a threshold value of the substrate and threshold values of the plurality of transfer mechanisms; and
   a monitoring part configured to monitor whether the intensity of the vibration exceeds at least one of the threshold value of the substrate and the threshold values of the plurality of transfer mechanisms and whether the vibration frequency of the transformed data transmitted from the analysis processing part is equal to at least one of the natural frequency of the substrate and the natural frequencies of the plurality of transfer mechanisms.

10. A non-transitory computer-readable recording medium storing a program used for a substrate processing apparatus comprising: a placement part whereon a substrate container is placed; a substrate retainer configured to support the substrate accommodated in the substrate container; a plurality of transfer mechanisms configured to transfer the substrate between the substrate container and the substrate retainer and to perform a transfer operation; a detector provided at one or more of the plurality of transfer mechanisms and configured to detect vibration while the plurality of transfer mechanisms is in operation; and a memory device configured to register in advance natural frequencies of the substrate and the one or more of the plurality of transfer mechanisms and a threshold value of the substrate and threshold values of the plurality of transfer mechanisms, wherein the program causes the substrate processing apparatus to perform:

(a) detecting vibration by the detector;
(b) transforming detection data of the vibration detected by the detector into transformed data; and
(c) determining whether an intensity of the vibration based on transformed data obtained by transforming detection data of the vibration detected by the detector exceeds at least one of the threshold value of the substrate and the threshold values of the plurality of transfer mechanisms and whether a vibration frequency based on the transformed data is equal to at least one of the natural frequency of the substrate and the natural frequencies of the plurality of transfer mechanisms.

* * * * *